United States Patent
Kita et al.

(10) Patent No.: US 7,288,877 B2
(45) Date of Patent: Oct. 30, 2007

(54) PIEZOELECTRIC FILM DEVICE, AND DRIVING METHOD OF THE SAME

(75) Inventors: Hiroyuki Kita, Osaka (JP); Hirokazu Uchiyama, Higahiosaka (JP); Toshiyuki Matsunaga, Katano (JP); Fumiyo Tojo, Gose (JP)

(73) Assignee: Matsushita Electric Industrial Co., Ltd., Osaka JPX ( * ) Notice: Subject to any disclaimer, the term of this patent is extended or adjusted under 35 U.S.C. 154(b) by 240 days.

(21) Appl. No.: 11/013,994

(22) Filed: Dec. 16, 2004

(65) Prior Publication Data

US 2005/0140249 A1  Jun. 30, 2005

(30) Foreign Application Priority Data

Dec. 16, 2003  (JP) ............... 2003-417801

(51) Int. Cl.
  *H01L 41/04* (2006.01)
  *H01L 41/08* (2006.01)
(52) U.S. Cl. ............ 310/359; 310/363; 310/364; 310/365; 310/366
(58) Field of Classification Search ........ 310/359, 310/363–366
  See application file for complete search history.

(56) References Cited

U.S. PATENT DOCUMENTS 4,336,510 A * 6/1982 Miyamori ............... 310/366

5,233,256 A * 8/1993 Hayashi et al. ............ 310/366

FOREIGN PATENT DOCUMENTS

| JP | 1-101673 | 4/1989 |
| JP | 3-256375 | 11/1991 |
| JP | 2002-279742 | 9/2002 |

OTHER PUBLICATIONS

I. Kanno et al., "Measurement of transverse piezoelectric properties of PZT thin films", Sensors and Actuators A: Physical, vol. 107, Issue 1, Oct. 1, 2003, pp. 68-74.

* cited by examiner

*Primary Examiner*—J. San Martin
(74) *Attorney, Agent, or Firm*—RatnerPrestia

(57) ABSTRACT

A piezoelectric film device has a piezoelectric film element and a power supply circuit. The piezoelectric film element is formed of a first electrode, a second electrode, and a piezoelectric film that is sandwiched between the first electrode and second electrode and has a polarization vector in the film thickness direction. The polarization vector is inverted by application of a predetermined voltage or higher through the first electrode and second electrode. The power supply circuit supplies voltage for inverting the polarization vector. The piezoelectric film has each different lattice constant depending on the direction of the polarization vector. The piezoelectric film device keeps a different displacement position corresponding to the direction of the polarization vector even when the voltage application is stopped.

10 Claims, 17 Drawing Sheets

PIEZOELECTRIC FILM DEVICE, AND DRIVING METHOD OF THE SAME

BACKGROUND OF THE INVENTION

1. Field of the Invention

The present invention relates to a piezoelectric film device that uses inversion of a polarization vector of a piezoelectric film and is applied to a positioning device or the like, and relates to a driving method of the piezoelectric film device

2. Background Art

Recently, a piezoelectric element has been used as a driving element of a positioning device and applied to various actuators. That is because the piezoelectric element has high conversion efficiency from electric energy to mechanical energy, can be driven by low power consumption, generates a small amount of heat, and does not cause magnetic interference.

However, the piezoelectric element has a problem that the relation between applied voltage and a displacement amount of the piezoelectric element has hysteresis and hence the displacement amount does not uniquely correspond to the applied voltage.

A driving method of minimizing the hysteresis of the piezoelectric element is disclosed by Japanese Patent Unexamined Publication No. H3-256375 (patent document). FIG. 19 is a characteristic diagram showing the relation between the displacement amount of a conventional piezoelectric element and applied voltage.

In FIG. 19, minimum voltage applied to the piezoelectric element is denoted as Vmin, and maximum voltage is denoted as Vmax. When the applied voltage is varied as Vmin→V1→Vmax→V1→Vmin, the displacement draws the hysteresis of A→C→B→D→A and hence the displacement is not uniquely determined. When the applied voltage is monotonically increased from Vmin as Vmin→V1→Vmax or monotonically decreased from Vmax as Vmax→V1→Vmin, however, respective voltage-displacement characteristic curves are A→C→B and B→D→A and the displacement corresponds to the applied voltage one-to-one. When a previously applied voltage (hereinafter referred to as previous voltage) before application of voltage V1 to the piezoelectric element is assumed to be Vmin, the displacement is $X_C$. When the previous voltage is assumed to be Vmax, the displacement is $X_D$. While, for obtaining displacement $X_C$, the applied voltage is set at V1 for previous voltage Vmin, or set at V4 for previous voltage Vmax. When the previous voltage is always set at Vmin or Vmax, the displacement is uniquely determined by applied voltage.

By the technique described above, the piezoelectric element can be uniquely positioned even when the piezoelectric element has hysteresis.

In the conventional driving method of minimizing hysteresis of the piezoelectric element, however, previous voltage Vmin or Vmax must be always applied before causing a desired displacement. In this case, displacement corresponding to the previous voltage occurs, so that desired displacements cannot be continuously obtained. When two positions of the desired displacement and the displacement determined by the previous voltage are controlled, for example, for retaining at least one displacement, voltage corresponding to the displacement must be continuously applied.

In the conventional driving method, any example of driving a piezoelectric element by inverting the polarization direction thereof is not included. An actuator using a conventional piezoelectric element is driven in a state where the polarization direction is kept the same. On the contrary, in a ferroelectric memory or the like, it is used in a state where the polarization direction is consciously inverted. However, the inversion of the polarization direction is limited to elements using not piezoelectric property but ferroelectric property.

The relation between the displacement in the film direction and the applied voltage at the tip of a unimorph-type cantilever formed of gold (Au) electrode/lead zirconate titanate (PZT) film/platinum (Pt) electrode/magnesium oxide (MgO) single-crystal substrate is disclosed in "Measurement of transverse piezoelectric properties of PZT thin films", "SENSORS AND ACTUATORS A: PHYSICAL", vol. 107 Issue 1, 1 Oct. 2003, p 68-p 74 (non-patent document). The PZT film shown in this document is estimated to be a complete c-axis orientation film. This document also shows that there is a high linearity between the applied voltage and the displacement. When alternating voltage of ±35V and 10 Hz is applied to the unimorph-type cantilever, the displacement behavior of the tip thereof forms a butterfly shaped loop, and the loop is asymmetric with respect to the polarization of the voltage.

This document shows that, when alternating voltage with simple sine wave is continuously applied to the conventional unimorph-type cantilever, the displacement asymmetric with respect to the polarization of the applied voltage occurs. However, the document does not show a displacement state of the cantilever obtained when the application of the alternating voltage is stopped. Regarding the voltage application, simple alternating voltage is continuously applied, but an applying method of voltage suitable for complex positional control is not described. Only the configuration of a unimorph-type cantilever having a film and a substrate used for forming the film is disclosed. A configuration where the substrate used in forming the film is removed or a configuration deformed by principles other than the unimorph-type is not disclosed.

SUMMARY OF THE INVENTION

A piezoelectric film device of the present invention has the following elements:
 a piezoelectric film element formed of the following elements:
  a first electrode;
  a second electrode; and
  a piezoelectric film that is sandwiched between the first electrode and second electrode and has a polarization vector in the film thickness direction which is inverted by application of a predetermined voltage or higher through the first electrode and second electrode; and
 a power supply circuit for supplying voltage for inverting the polarization vector.

The piezoelectric film has each different lattice constant depending on the direction of the polarization vector. The piezoelectric film element keeps a different displacement position corresponding to the direction of the polarization vector even with the voltage application stopped.

A piezoelectric film device of the present invention has the following elements:
 a piezoelectric film element formed by bonding together the following elements:
  a first structure formed of the following elements:
   a first electrode;
   a second electrode; and a piezoelectric film that is sandwiched between the first electrode and second electrode and has a polarization vector in the film thickness direction which is inverted by application of a predetermined voltage or higher through the first electrode and second electrode; and a second structure formed of the following elements:
a third electrode;
a fourth electrode; and
a piezoelectric film that is sandwiched between the third electrode and fourth electrode and has a polarization vector in the film thickness direction which is inverted by application of a predetermined voltage or higher through the third electrode and fourth electrode; and a power supply circuit for supplying voltage for inverting the polarization vector.

The piezoelectric film has each different lattice constant depending on the direction of the polarization vector. The piezoelectric film element keeps a different displacement position corresponding to the direction of the polarization vector even with the voltage application stopped.

A piezoelectric film device of the present invention has the following elements:

a piezoelectric film element formed of the following elements:
a first electrode;
a second electrode; and
a piezoelectric film that is sandwiched between the first electrode and second electrode and has a polarization vector in the film thickness direction which is inverted by application of a predetermined voltage or higher through the first electrode and second electrode; and a power supply circuit for supplying voltage for inverting the polarization vector.

Here, the longitudinal end surfaces of the piezoelectric film are faced to each other. The piezoelectric film has each different lattice constant depending on the direction of the polarization vector. The piezoelectric film element keeps two opening and closing positions on an end surface correspondingly to the direction of the polarization vector even with the voltage application stopped.

A piezoelectric film device of the present invention has the following elements:

an open/close piezoelectric element including the following elements:
a first piezoelectric film element formed of the following elements:
a first electrode;
a second electrode; and
a piezoelectric film that is sandwiched between the first electrode and second electrode and has a polarization vector in the film thickness direction which is inverted by application of a predetermined voltage or higher through the first electrode and second electrode; and a second piezoelectric film element formed of the following elements:
a third electrode;
a fourth electrode; and
a piezoelectric film that is sandwiched between the third electrode and fourth electrode and has a polarization vector in the film thickness direction which is inverted by application of a predetermined voltage or higher through the third electrode and fourth electrode; and a power supply circuit for supplying voltage for inverting the polarization vector.

Here, one end of the first piezoelectric film element faces one end of the second piezoelectric film element, the other end of the first element and the other end of the second element are supported by and fixed to a support body, and the first and second piezoelectric film elements and the support body form a triangle. The piezoelectric film has each different lattice constant depending on the direction of the polarization vector. One end of the piezoelectric film is opened or closed by inversion of the polarization vector, and the piezoelectric film keeps an opening/closing position by inversion of the polarization vector even with the voltage application stopped.

A piezoelectric film device of the present invention has the following elements:

a piezoelectric film element formed by integrating, at different angles with respect to the longitudinal direction, the following elements:
a first element section including the following elements:
a first electrode;
a second electrode; and
a piezoelectric film that is sandwiched between the first electrode and second electrode and has a polarization vector in the film thickness direction which is inverted by application of a predetermined voltage or higher through the first electrode and second electrode; and a second element section including the following elements:
a third electrode;
a fourth electrode; and
a piezoelectric film that is sandwiched between the third electrode and fourth electrode and has a polarization vector in the film thickness direction which is inverted by application of a predetermined voltage or higher through the third electrode and fourth electrode; and a power supply circuit for supplying voltage for inverting the polarization vector.

The piezoelectric film has each different lattice constant depending on the direction of the polarization vector. The piezoelectric film element keeps a plurality of two-dimensional displacement positions provided by combining respective displacement positions of the first and second element sections correspondingly to the direction of the polarization vector even with the voltage application stopped.

A driving method of a piezoelectric film device of the present invention has the following steps:
applying voltage only in inverting polarization vector; and
keeping two displacement positions without supplying voltage after inversion of polarization vector.

The piezoelectric film device has the following elements:
a piezoelectric film element formed of the following elements:
a first electrode;
a second electrode; and
a piezoelectric film that is sandwiched between the first electrode and second electrode and has a polarization vector in the film thickness direction; and a power supply circuit for supplying voltage for inverting the polarization vector to the piezoelectric film element through the first electrode and second electrode.

The piezoelectric film has each different lattice constant depending on the direction of the polarization vector. The piezoelectric film element keeps a different displacement position corresponding to the direction of the polarization vector even with the voltage application stopped.

DETAILED DESCRIPTION OF THE INVENTION

Figure 1:
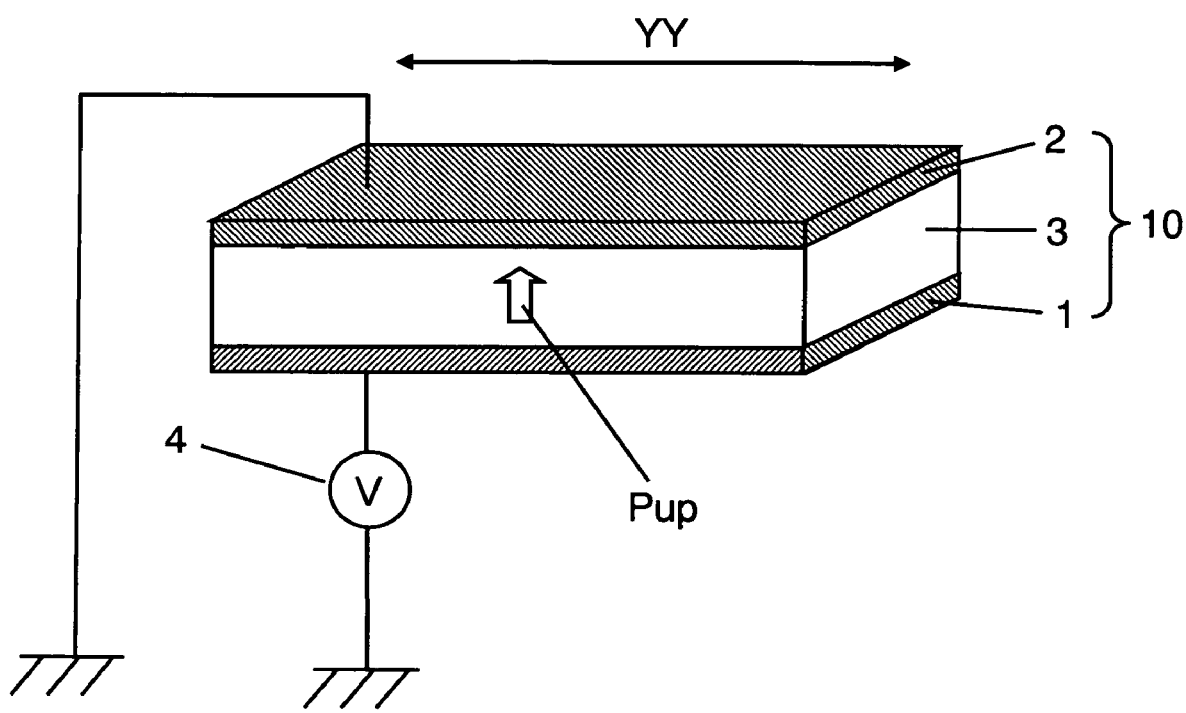
FIG. 1 is a perspective view showing a basic configuration of piezoelectric film devices in accordance with exemplary embodiments of the present invention.

FIG. 1 is a perspective view showing a basic configuration of piezoelectric film devices in accordance with exemplary embodiments of the present invention.

Firstly, taking a PZT film as an example, a basic manufacturing method and a characteristic of a piezoelectric film element forming the piezoelectric film devices in accordance with exemplary embodiments of the present invention will be described with reference to FIG. 1. When there is a difference in the manufacturing methods or the like, each manufacturing method is described in each exemplary embodiment.

Pt film with (100) crystal orientation is formed as first electrode 1 on (100) MgO single crystal substrate (not shown). About 3 μm-thick piezoelectric film 3 made of PZT film is formed on the MgO single crystal substrate (hereinafter referred to as MgO substrate) kept at temperature 600° C. by a sputtering method or the like.

At this time, film forming is performed by sputtering method with a target of PbZr$_{0.53}$Ti$_{0.47}$O$_3$+20 mol % PbO in a condition where sputtering gas composition is Ar(argon):O$_2$(oxygen)=90:10 and sputtering gas pressure is 0.5 Pa.

Second electrode 2 made of Pt is then formed on piezoelectric film 3 made of PZT film at room temperature.

The product is then processed into a rectangular shape where longitudinal YY length is 2 mm and width is 0.5 mm for example, using a general film processing method such as etching or dicing.

The MgO substrate is removed by wet etching using phosphoric acid, dry etching, or chemical mechanical planarization (CMP) method, and a piezoelectric film device having piezoelectric film element 10 is produced. In producing the piezoelectric film device, the MgO substrate may be left as a supporting/fixing section (not shown) for supporting and fixing piezoelectric film element 10.

The characteristic of produced piezoelectric film 3 is described hereinafter.

According to a result by X-ray diffraction (XRD) analysis, piezoelectric film 3 made of PZT film produced by the method discussed above has a perovskite type tetragonal crystal structure and c-axis orientation with about 99% of degree. The c-axis direction of the tetragonal PZT film equals to the polarization vector direction, so that the PZT film has a polarization axis in the thickness direction.

The degree of the crystal orientation discussed above is determined from peak ratio intensity (001)/Σ(hk1) of the X-ray diffraction. The Σ(hk1) is the sum of reflection peak intensities caused in the PZT film, and is measured in θ·2θ measurement using a Cu-Kα ray source. Here, the upper and lower limits of 2θ are set in minimum ranges allowing measurement of (001) reflection to (111) reflection.

The polarization vector of piezoelectric film 3 is defined as follows. Generally, rotation or inversion of a ferroelectric domain of piezoelectric film 3 can be induced by applying voltage from power supply circuit 4 between first electrode 1 and second electrode 2. When a sufficiently large positive voltage is applied to first electrode 1, the rotation or inversion of the ferroelectric domain becomes full and the film thickness direction of the polarization vector directs from first electrode 1 to second electrode 2, namely Pup in FIG. 1. When a sufficiently large negative voltage is applied to first electrode 1, the rotation or inversion of the ferroelectric domain becomes full and the film thickness direction of the polarization vector directs from second electrode 2 to first electrode 1, namely Pdown (not shown in FIG. 1). The polarization vector is not required to parallel to the film thickness direction, but may be diagonal to the film thickness direction or may have a component in the film thickness direction.

Figure 2:
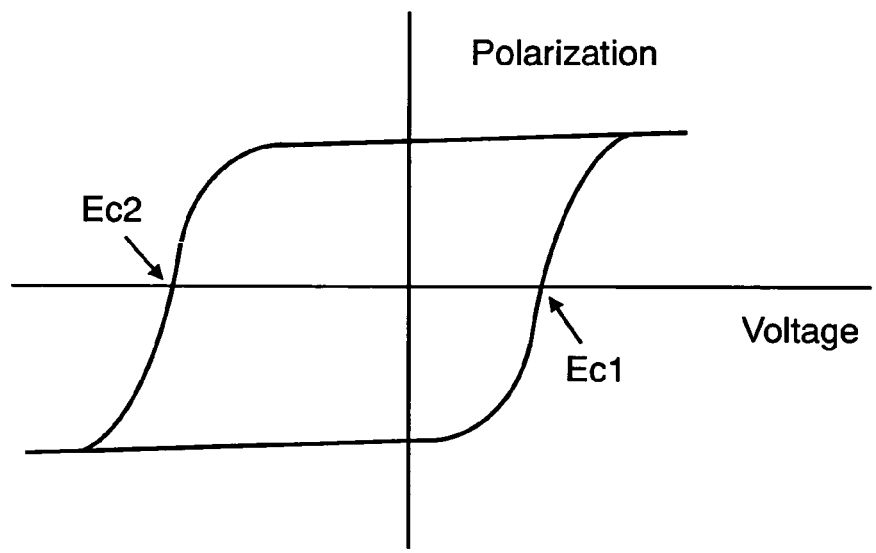
FIG. 2 is a characteristic diagram showing a relation between polarization of a piezoelectric film element of the piezoelectric film devices and applied voltage.

FIG. 2 is a characteristic diagram showing a relation between polarization of piezoelectric film element 10 measured using the configuration of FIG. 1 and applied voltage. As shown in FIG. 2, piezoelectric film element 10 has an asymmetric hysteresis characteristic, and coercive voltage (coercive electric field) generating inversion of the polarization vector is Ec2=−30 V (−100 kV/cm) and Ec1=15 V (50 kV/cm).

Next, results of measured lattice constant of the PZT film used in piezoelectric film 3 are described hereinafter.

A piezoelectric film device having a configuration of 30 nm thick second electrode (Pt)/3 μm thick PZT film/20 nm thick first electrode (Pt)/300 μm thick MgO substrate (100) is processed in the following conditions, and the lattice constant of the PZT film is measured.

Processing condition 1: Sample where the polarization vector directs from the first electrode to second electrode.

Processing condition 2: Sample where the polarization vector directs from the second electrode to first electrode.

Even if polarization processing is not performed, in some film forming condition, the sample in processing condition 1 where the polarization vectors are substantially completely aligned from first electrode to second electrode is obtained. When the polarization vectors are not aligned from the first electrode to second electrode, the sample in processing condition 1 can be obtained by applying 45 V (150 kV/cm), which is higher than Ec of +15 V, to the first electrode for 5 s. The sample in processing condition 2 can be obtained by applying −90 V (300 kV/cm), which is higher than Ec of −30 V as an absolute value, to the first electrode for 5 s, for example.

Figure 3:
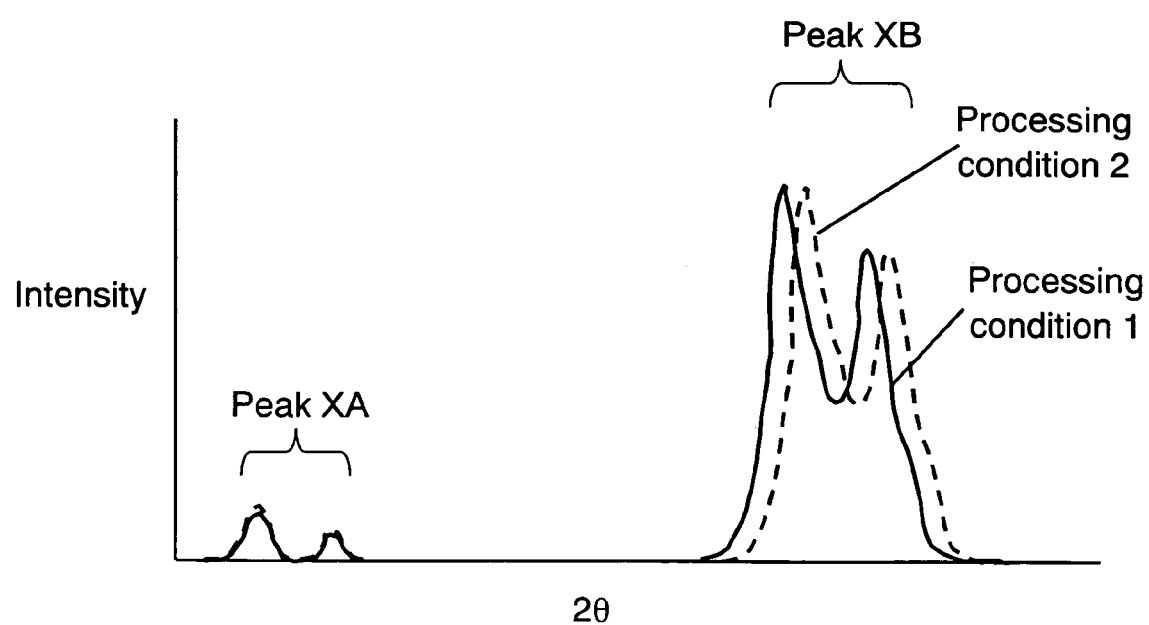
FIG. 3 is a schematic diagram of an X-ray diffraction pattern showing variation of the lattice constant in the polarization vector direction of the piezoelectric film of the piezoelectric film devices.

FIG. 3 is a schematic diagram of an X-ray diffraction pattern with high resolution. This pattern is measured with no voltage applied after piezoelectric film element 10 of the piezoelectric film device is processed in processing condition 1 (solid line) and processing condition 2 (dashed line). A Cu-Kα ray source is used as the X-ray source, and the angle range of about 42° to about 44° is used as 2θ. Peaks XA shown in FIG. 3 are X-ray diffraction peaks caused by (200) reflection of the MgO substrate. The number of peaks XA is two because the X-ray source used for measurement includes two wavelengths of Cu-Kα 1 ray and Cu-Kα 2 ray. When the measurement resolution is low, the number of detected peaks XA is one. While peaks XB shown in FIG. 3 are X-ray diffraction peaks caused by (002) reflection of the PZT film. The number of peaks XB is two for the same reason. Comparing processing condition 1 and processing condition 2 with each other, the positions of peaks XA caused by the reflection of the MgO substrate are not varied, but the positions of peaks XB caused by the (002) reflection of the PZT film are shifted. This behavior indicates that the lattice constant in the [001] direction in processing condition 1 is different from that in processing condition 2. Here, the [001] direction is the film thickness direction of the PZT film.

In the result of the X-ray diffraction pattern with high resolution, the lattice constant corresponding to the film thickness direction of the PZT film is determined. This lattice constant is a value obtained when the PZT film lies on the MgO substrate. The lattice constant in the [100] direction corresponding the film in-plane direction of the PZT film is not determined.

Therefore, the MgO substrate is removed from a piezoelectric film device by the wet etching method using phosphoric acid or the like, and the formed film is further powdered for convenience of measurement. Here, the piezoelectric film device has a piezoelectric film element that has undergone each of two different processings discussed above to form a piezoelectric film. A diffraction pattern of the powdered piezoelectric film by synchrotron orbital radiation (SOR) is measured. Based on the measured result, the lattice constant of the piezoelectric film formed of the PZT film is determined by a Rietveld analyzing method.

Table 1 shows lattice constants of the piezoelectric film determined from the SOR diffraction pattern by the Rietveld analyzing method. Here, the [100] direction, in-plane in this case, is called a-axis, and the lattice constant thereof is denoted as "a". While, the [001] direction, film thickness direction in this case, is called c-axis, and the lattice constant thereof is denoted as "c".

TABLE 1

|   | Processing condition 1 (Å) | Processing condition 2 (Å) | Processing condition 2/ Processing condition 1 |
|---|---|---|---|
| a | 4.071 | 4.076 | 1.0012 |
| c | 4.121 | 4.111 | 0.9976 |

Table 1 indicates that assuming the length of the sample in processing condition 1 to be 1, lattice constant "a" of a-axis is changed to 1.0012 by inversion of the direction of the polarization vector. The piezoelectric film element using a piezoelectric film having the crystal orientation is expanded and contracted in the film in-plane direction by switching the polarization vector direction between Pup and Pdown. For example, the expansion/contraction amount of piezoelectric film element 10 of which length in the longitudinal direction YY shown in FIG. 1 is 2 mm is 2.4 μm. The expansion/contraction amount can be arbitrarily set by varying the length in the longitudinal direction YY. Similarly, lattice constant "c" of c-axis is also changed to 0.9976, and the piezoelectric film element is expanded and contracted in the thickness direction by switching the polarization vector direction between Pup and Pdown.

Even when the polarization vector is inverted by applying voltage not lower than the coercive voltage and is then left for 10 days with no voltage applied, the expansion/contraction amount of the piezoelectric film element is not varied and is kept stable.

As discussed above, the present invention is performed based on new findings that the lattice constant of the piezoelectric film is changed by switching the polarization vector between upward direction and downward direction (180° of inversion). The 180° of inversion of the polarization vector of the piezoelectric film can be easily controlled by switching polarity of the applied voltage, so that it is practically advantageous.

Exemplary embodiments of the present invention will be described hereinafter with reference to the drawings.

First Embodiment

Figure 4:
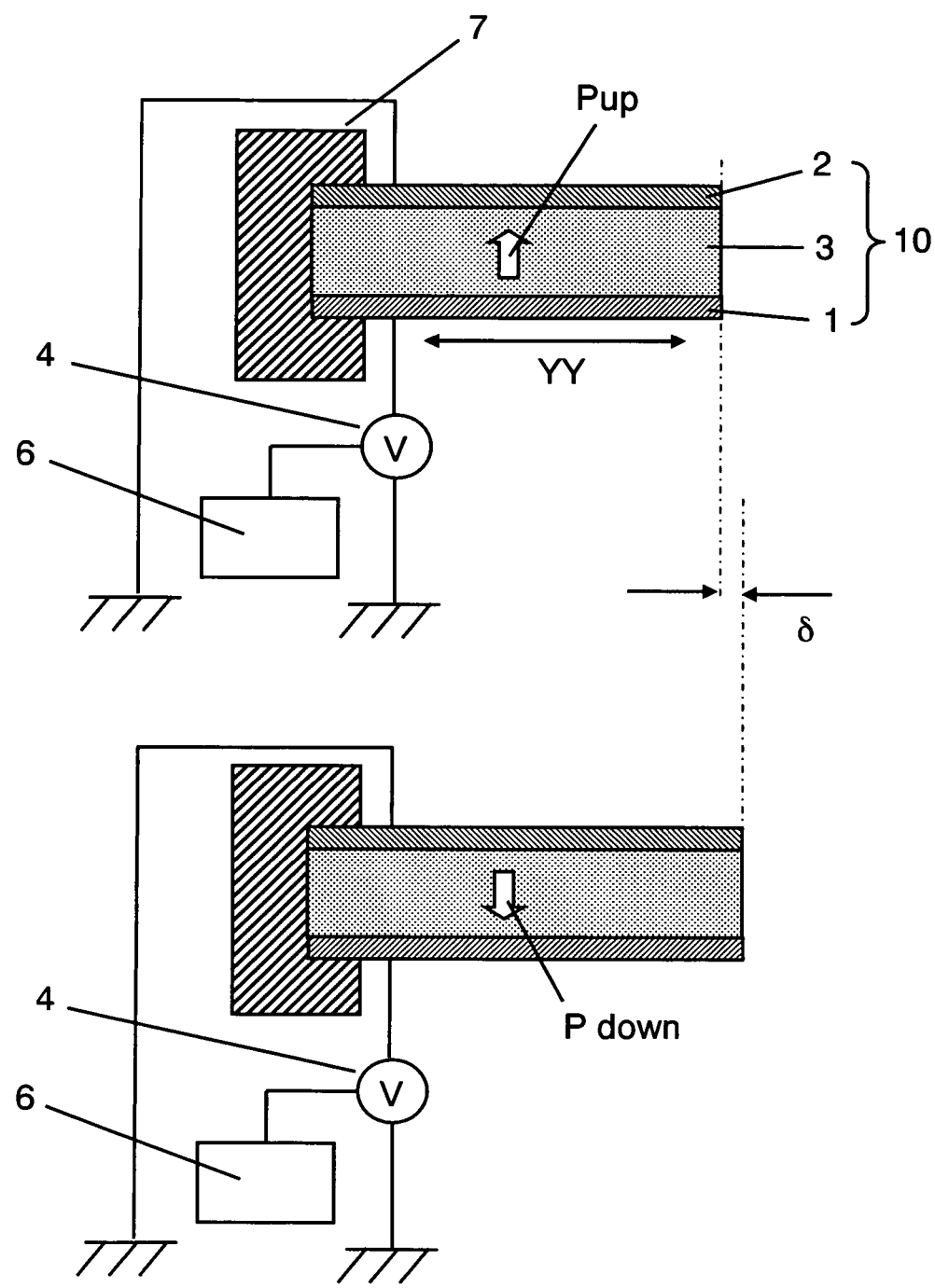
FIG. 4 is sectional views showing a cantilever configuration in a piezoelectric film device in accordance with exemplary embodiment 1 of the present invention.

The upper view of FIG. 4 is a sectional view showing a piezoelectric film device having a cantilever configuration having polarization vector Pup in accordance with exemplary embodiment 1 of the present invention. The lower view of FIG. 4 is a sectional view showing a state where the piezoelectric film device is expanded by displacement δ. This state is obtained when the direction of the polarization vector is inverted. In FIG. 4, the thickness direction is extended to aid understanding. This is the same in each exemplary embodiment.

In the upper view of FIG. 4, piezoelectric film element 10 has first electrode 1, piezoelectric film 3 including polarization vector Pup, and second electrode 2. First electrode 1 and second electrode 2 are connected to power supply circuit 4 for applying voltage capable of inverting the direction of the polarization vector of piezoelectric film 3 and control circuit 6 thereof. One end of piezoelectric film element 10 in the longitudinal direction YY is fixed to fixing member 7 with an adhesive.

Polarization vector Pup is inverted in the polarization vector Pdown direction as shown in the lower view of FIG. 4, by applying voltage not lower than a predetermined value from power supply circuit 4 to piezoelectric film 3. The piezoelectric film device having a cantilever configuration displacing in the longitudinal direction YY is thus formed. As a result, the piezoelectric film device where two displacement positions can be stably positioned by inverting the polarization vector is realized.

The predetermined voltage means a voltage for generating an electric field for inverting the polarization vector. In other words, in the piezoelectric film configuration, the predetermined voltage means voltages (hereinafter referred to as coercive voltages) corresponding to Ec1 and Ec2 shown in FIG. 2.

Fixing member 7 is a separate member in embodiment 1, but is not limited to this. For example, the MgO substrate except a fixing section of piezoelectric film element 10 may be removed to form the fixing section (not shown).

Specific positioning operations of the piezoelectric film device are described hereinafter.

Figure 5:
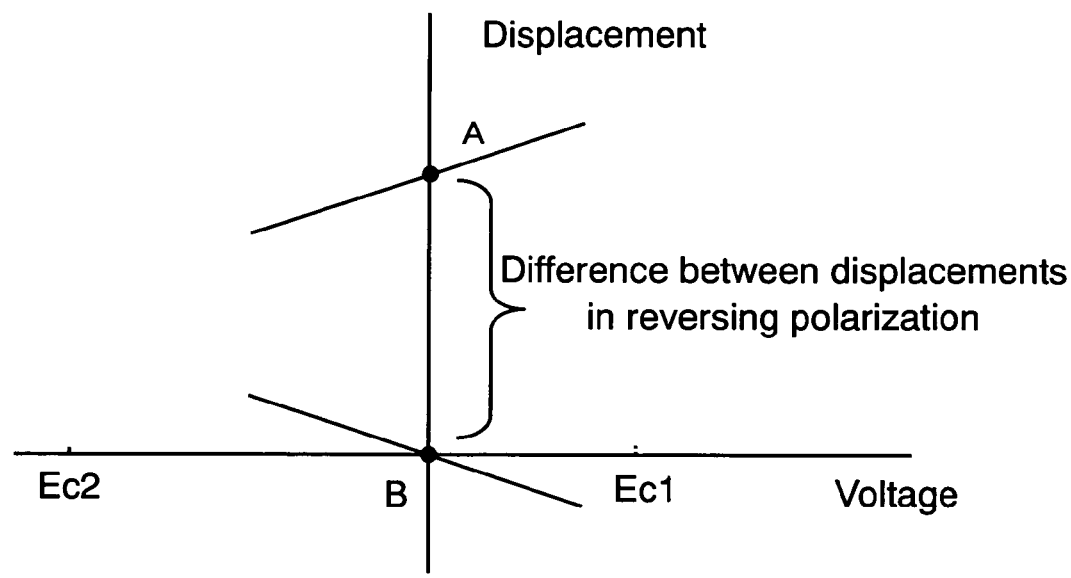
FIG. 5 shows a relation between a displacement amount of the piezoelectric film of the piezoelectric film device and applied voltage in accordance with exemplary embodiment 1.

FIG. 5 shows a relation between applied voltage and a displacement amount of the piezoelectric film device. The free end of the element having polarization vector Pup in FIG. 4 with no voltage applied is regarded as the reference position.

Displacement A indicates the displacement obtained when negative voltage which is larger than Ec2 of −30 V as absolute value is applied to make the polarization state as Pdown in FIG. 4, and the voltage is then set zero. Displacement B indicates the displacement obtained when positive voltage which is larger than Ec1 of +15 V is applied to make the polarization state as Pup in FIG. 4, and the voltage is then set zero. It is noted that "Ec1=15 V and Ec2=−30 V" is an examples for this embodiment and, generally speaking, the values depend on dielectric material.

In other words, FIG. 5 shows that two positions of displacement A and displacement B can be stably kept dependently on the direction of the polarization vector even when the voltage application is stopped.

As shown in FIG. 5, by applying voltage in a range where inversion of the polarization vector does not occur, the displacement amount of the piezoelectric element can be controlled with high linearity, which can be seen as two lines about the position of displacement A or B. In the piezoelectric film device of embodiment 1 for example, the displacement amount can be controlled at 0.05 μm/V in a voltage range not higher than the coercive voltage.

A driving method of a piezoelectric film device is described hereinafter.

Figure 6:
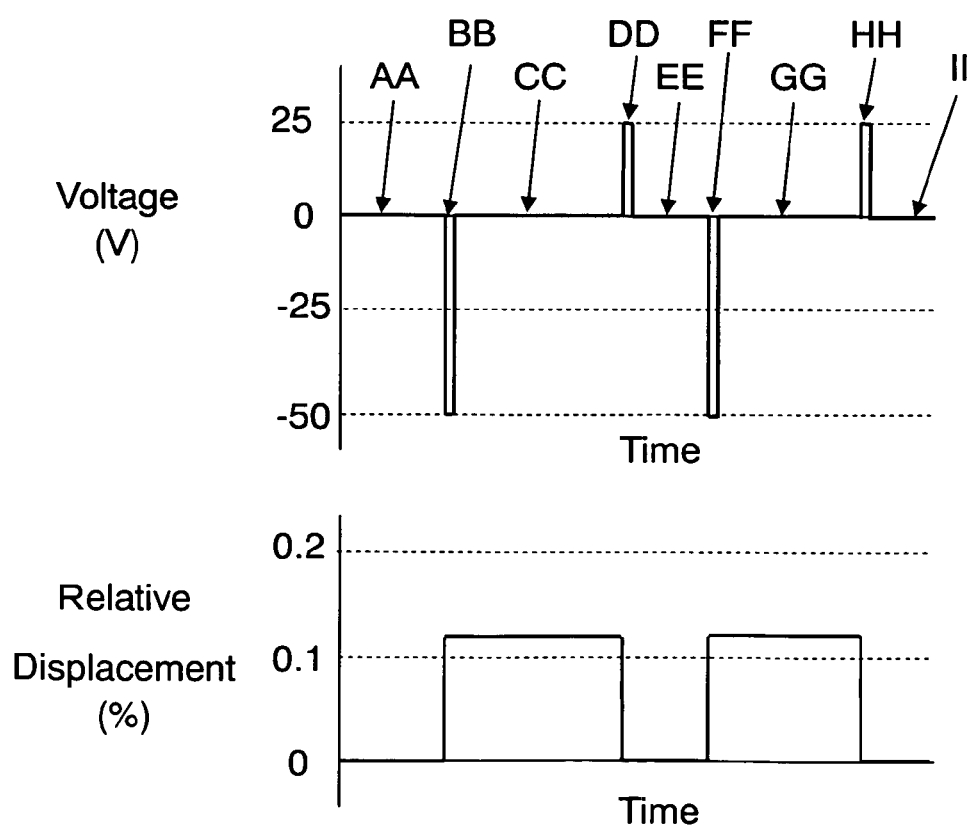
FIG. 6 shows a relation during driving between a relative displacement amount of the piezoelectric film of the piezoelectric film device and the applied voltage in accordance with exemplary embodiment 1.

FIG. 6 shows an example of the driving method of a piezoelectric film device, and shows the relation between relative displacement amount of the piezoelectric film and applied voltage during driving. In FIG. 6, in period AA, the piezoelectric film is kept in an initial state having no displacement. In period BB, −50 V, which is larger as an absolute value than coercive voltage Ec2 of −30V, is applied for inverting the polarization vector. In this period, polarization vector Pup is inverted in the polarization vector Pdown direction, and the lattice constant of the piezoelectric film increases by 0.12%. In period CC in which the applied voltage is kept zero, the lattice constant of the piezoelectric film is kept in a state after the increase by 0.12%.

In period DD, +25 V, which is larger than coercive voltage Ec1 of 15 V, is applied for inverting the polarization vector. In this period, the piezoelectric film is returned to the initial state by the inversion, and the lattice constant of the piezoelectric film decreases by 0.12%. In period EE in which the applied voltage is kept zero, the lattice constant of the piezoelectric film is kept in the initial state after the decrease by 0.12%. In periods FF to II, similar operations can be performed.

The operations of repeating two displacement positions are described in FIG. 6. However, the displacement can be changed finely in period CC or period EE by applying a voltage between Ec1 and Ec2 by power supply circuit 4. The voltage is not higher than the coercive voltage of Ec1 or Ec2 as absolute value, so that a polarization vector does not reverse. As a result, this "fine control" does not disturb the "two-state control" shown in FIG. 6. In this "fine control", the displacement amount can be controlled around the position A in period CC or around the position B in period EE. The control can be done with high linearity as shown in FIG. 5 as two lines.

As discussed above, inverting the polarization vector changes the lattice constant of the piezoelectric film in the piezoelectric film device of the present invention, and thus two longitudinal YY displacement positions corresponding to the difference between the lattice constants can be kept even when the voltage application is stopped.

The driving method exploits the displacement caused by polarization switching, so that the displacement can be kept without electricity consumption.

Additionally, the device can be finely adjusted by applying voltage in a range that does not cause inversion of the polarization.

In this embodiment, the piezoelectric film device using a rectangular piezoelectric film element has been described; however, a used piezoelectric film element may have a plate shape and a polygonal electrode-formed surface and is not limited especially. In the latter case, similar advantageousness is also obtained.

Second Embodiment

Figure 7A:
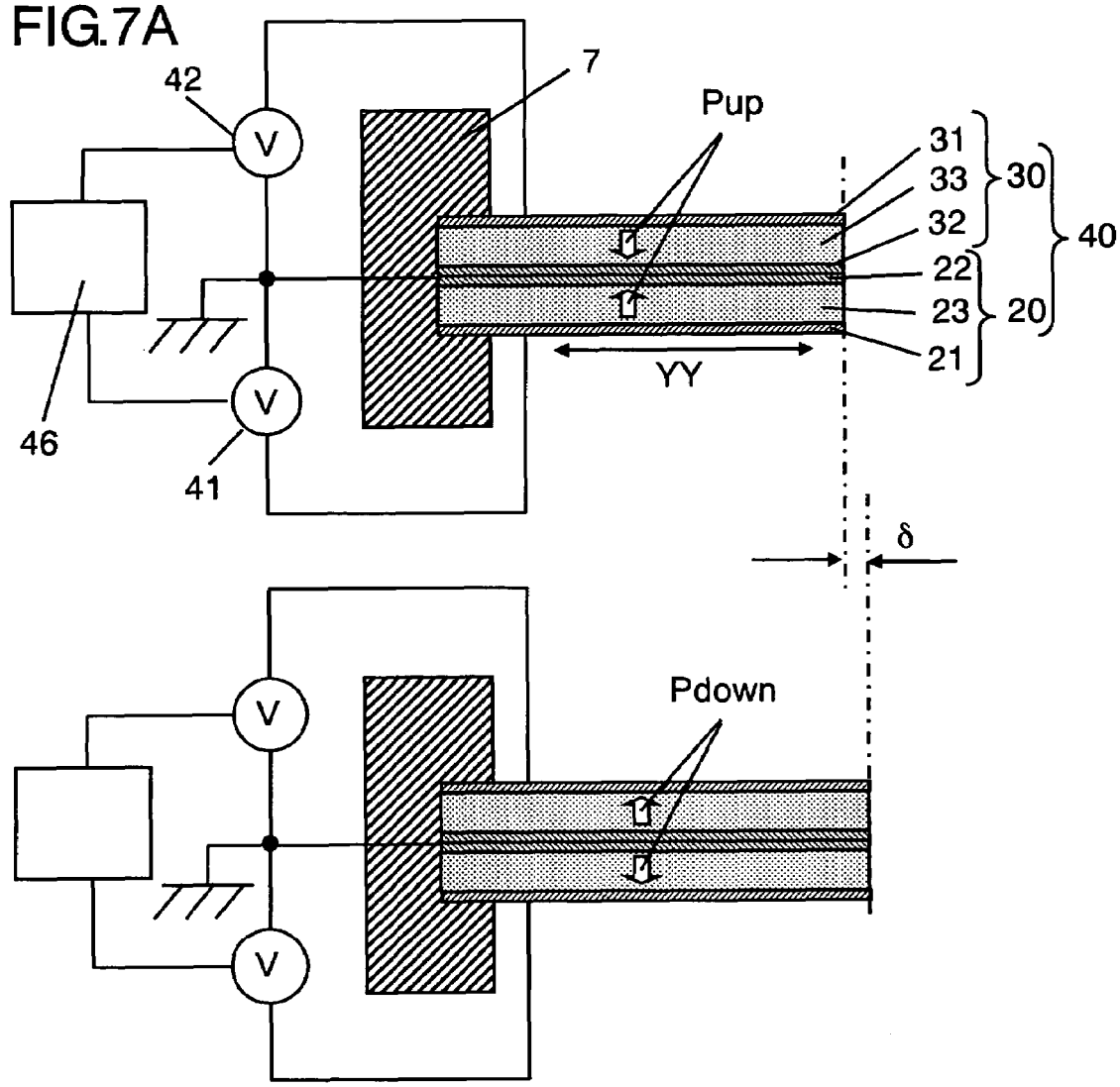
FIG. 7A is a sectional view of a bimorph-type piezoelectric film device in accordance with exemplary embodiment 2 of the present invention.

FIG. 7A is sectional views of a bimorph-type piezoelectric film device having a cantilever configuration with polarization vector Pup in accordance with exemplary embodiment 2 of the present invention. The lower view of FIG. 7A is a sectional view showing an extending state of the piezoelectric film device by displacement amount δ. This state is obtained when polarization vector Pup is inverted in the polarization vector Pdown direction.

In FIG. 7A, first structure 20 has first electrode 21, piezoelectric film 23 including polarization vector Pup, and second electrode 22. Second structure 30 has third electrode 31, piezoelectric film 33 including polarization vector Pup, and fourth electrode 32. Second electrode 22 of first structure 20 is adhered to fourth electrode 32 of second structure 30 to form bimorph-type piezoelectric film element 40.

First electrode 21, second electrode 22, third electrode 31, and fourth electrode 32 are connected to power supply circuits 41 and 42 for applying voltage for inverting the direction of the polarization vectors of piezoelectric films 23 and 33 and control circuit 46 thereof.

One end of bimorph-type piezoelectric film element 40 in the longitudinal direction YY is fixed to fixing member 7, and voltage not lower than coercive voltage is applied from power supply circuits 41 and 42 to piezoelectric film 23 and 33 to invert the direction of the polarization vector. The piezoelectric film device having the cantilever configuration displacing in the longitudinal direction YY is formed as shown in FIG. 7A.

A manufacturing method of bimorph-type piezoelectric film element 40 is described hereinafter.

First structure 20 and second structure 30 that are made of piezoelectric film elements manufactured by the method of embodiment 1 are adhered to each other on second electrode 22 and fourth electrode 32 sides so that the MgO substrate is disposed outside.

The MgO substrate is removed by wet etching or the CMP method using phosphoric acid or the like, and bimorph-type piezoelectric film element 40 is formed. In this case, the polarization vector Pup directions of first structure 20 and second structure 30 are opposite.

Piezoelectric film element 40 is processed into a rectangular shape where longitudinal YY length is 2 mm and width is 0.5 mm, for example, using a typical film processing method, and one end in the longitudinal direction YY is fixed, thereby forming the bimorph-type piezoelectric film device.

Operations of the bimorph-type piezoelectric film device formed in this method are described hereinafter.

When coercive voltage not lower than −30 V is applied from power supply circuits 41 and 42 to first electrode 21 of first structure 20 and third electrode 31 of second structure 30 in the upper view of FIG. 7A, polarization vectors Pup of first structure 20 and second structure 30 invert in the polarization vector Pdown directions, and piezoelectric film element 40 is extended by displacement amount δ0 in the longitudinal direction YY.

When coercive voltage not lower than +15 V is applied from power supply circuits 41 and 42 to first electrode 21 of first structure 20 and third electrode 31 of second structure 30, polarization vectors Pdown of first structure 20 and second structure 30 invert in the polarization vector Pup directions, and piezoelectric film element 40 returns to the initial position.

If first structure 20 and second structure 30 are arranged to be driven in parallel, they can obviously driven by one power supply.

Figure 7B:
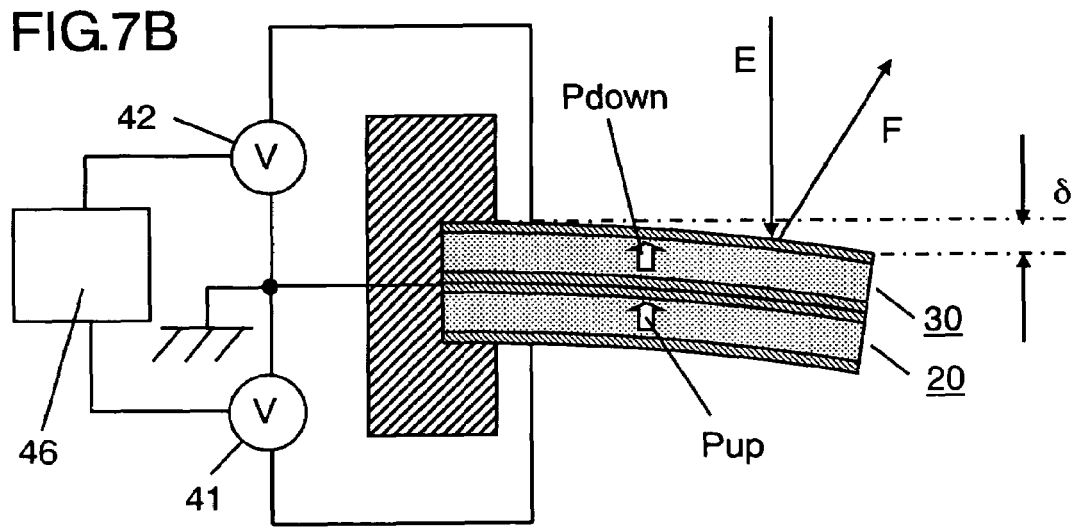
FIG. 7B is a sectional view showing a displacement state when direction of a polarization vector of one piezoelectric film element is inverted in the piezoelectric film device.

When coercive voltage not lower than −30 V is applied from power supply circuit 42 to only second structure 30 as shown in FIG. 7B, polarization vector Pup of second structure 30 inverts in the polarization vector Pdown direction, and second structure 30 extends in the longitudinal direction YY. While, first structure 20 does not displace, so that piezoelectric film element 40 has downward deflection δ.

When coercive voltage not lower than −30 V is applied from power supply circuit 41 to only first structure 20, the piezoelectric film element deflects upward, and this position is kept even with no voltage applied. In this case, a piezoelectric film device capable of positioning three displacement positions, namely the upward deflection position, the initial position, and the downward deflection position, can be realized. In FIG. 7B, incident light E is deflected in the reflected light F direction by the downward deflection of piezoelectric film element 40. When piezoelectric film element 40 deflects upward, reflected light E can be deflected in the opposite direction to reflected incident light F with respect to incident light E. In other words, a piezoelectric film device having a function like an optical switch can be realized by deflection of piezoelectric film element 40. The incident light can be reflected to an arbitrary position by controlling the displacement amount in a voltage range where the polarization vector is not inverted.

When the piezoelectric film devices are arranged in a matrix shape and the reflection direction of the incident light is controlled, the piezoelectric film devices can be used as an information display device of an image or a character.

In embodiment 2, a configuration where second electrode 22 of first structure 20 is adhered to fourth electrode 32 of second structure 30 has been described. This configuration is formed by assuming that the piezoelectric film element is formed on the MgO substrate. If there is no MgO substrate, the adhering direction is not limited especially.

The direction of the polarization vector can be arbitrarily selected by adhering the first structure to the second structure after inverting the polarization directions of the structures.

Third Embodiment

Figure 8A:
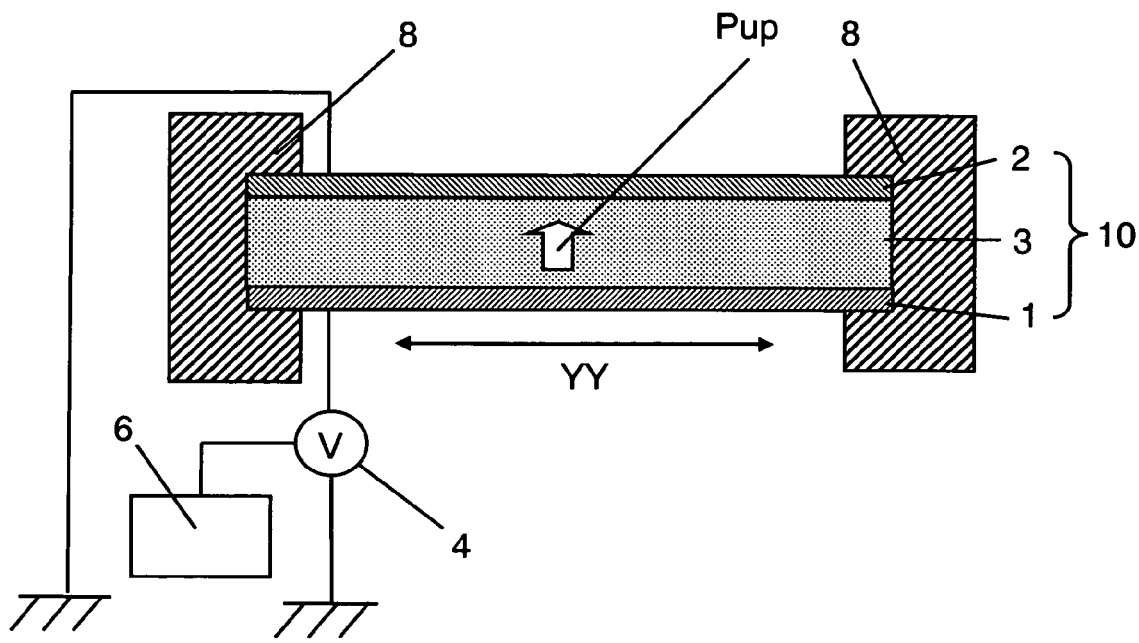
FIG. 8A is a sectional view of a piezoelectric film device having a both-end fixed configuration in accordance with exemplary embodiment 3 of the present invention.
Figure 8B:
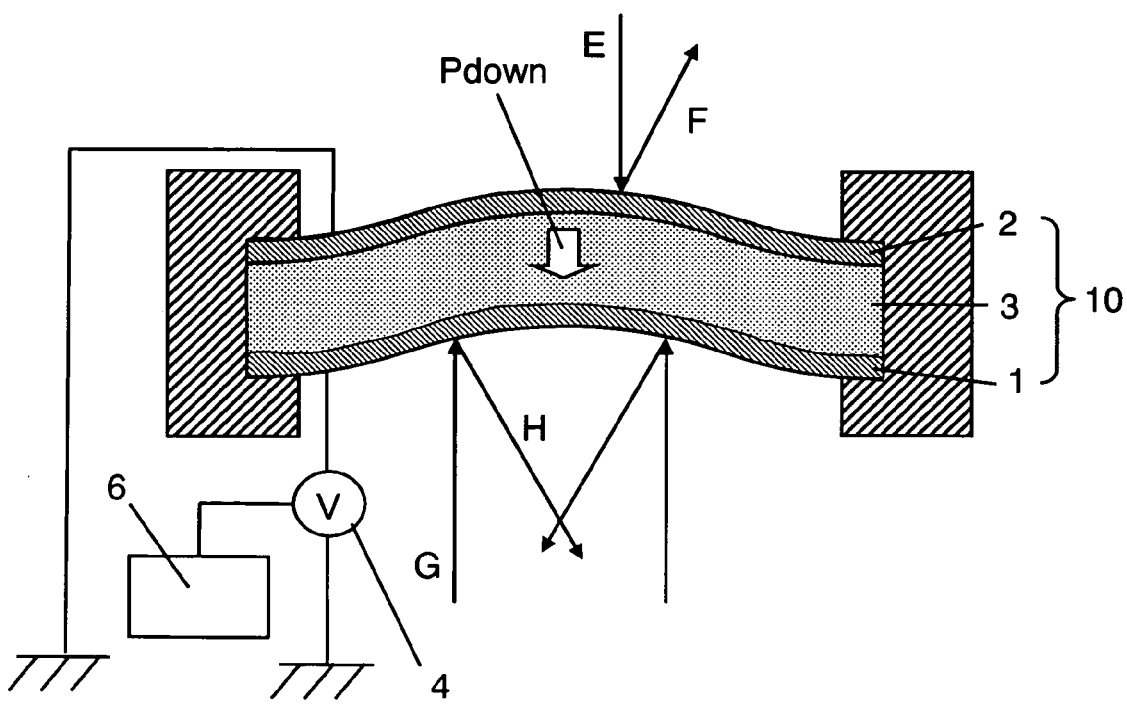
FIG. 8B is a sectional view showing a displacement state when direction of a polarization vector is inverted in the piezoelectric film device.

FIG. 8A is a sectional view of a piezoelectric film device having a both-end fixed configuration with polarization vector Pup in accordance with exemplary embodiment 3 of the present invention. FIG. 8B is a sectional view showing a deflected state of the piezoelectric film device when polarization vector Pup is inverted in the polarization vector Pdown direction.

The configuration and the manufacturing method of piezoelectric film element 10 are similar to those in embodiment 1 except fixing member 8 for fixing both ends of piezoelectric film element 10, so that detailed description is omitted.

Piezoelectric film element 10 manufactured by a method similar to that in embodiment 1 is processed into a rectangular shape using a typical film processing method, and both ends in the longitudinal direction YY are fixed by fixing member 8, thereby forming a both-end fixed piezoelectric film device. The rectangular shape has longitudinal YY length of 2 mm and width of 0.5 mm, for example.

Operations of this both-end fixed piezoelectric film device are the same as those in embodiment 1. When voltage not lower than coercive voltage for inverting the polarization vector in the polarization vector Pdown direction is applied to the gap between first electrode 1 and second electrode 2 of piezoelectric film element 10, piezoelectric film element 10 extends in the longitudinal direction YY. However, both ends of piezoelectric film element 10 are fixed, so that deflection is generated as shown in FIG. 8B.

Thanks to this deflection, incident light E coming into piezoelectric film element 10 lying at the initial position of FIG. 8A can be converted to reflected light F having varied reflection angle as shown in FIG. 8B. Thus, a piezoelectric film device such as an optical switch that deflects an optical path can be realized.

Reflected light H of incident light G can be collected linearly or made to form an image using the recessed surface of FIG. 8B.

Figure 9A:
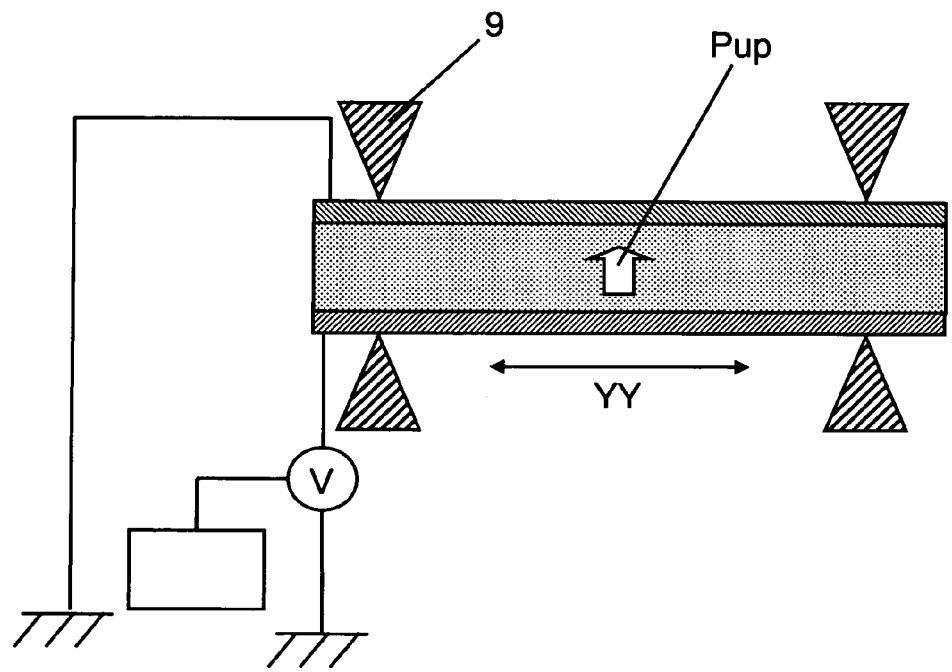
FIG. 9A is a sectional view of a piezoelectric film device having a both-end supported configuration in accordance with exemplary embodiment 3 of the present invention.
Figure 9B:
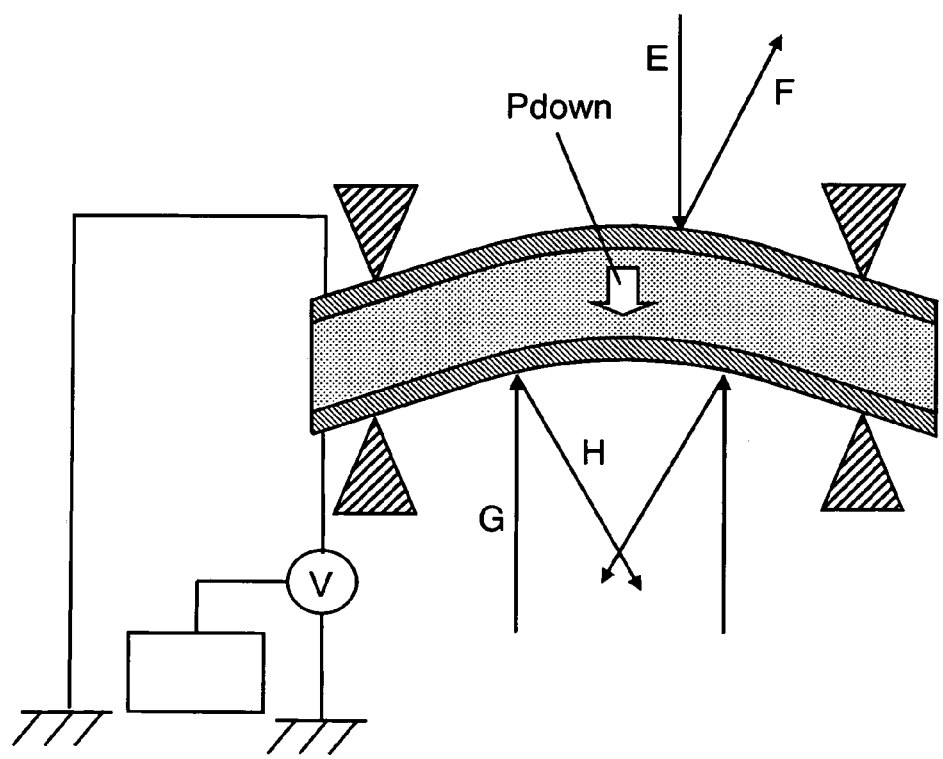
FIG. 9B is a sectional view showing a displacement state when direction of a polarization vector is inverted in the piezoelectric film device.

A configuration where the piezoelectric film element is fixed at both ends has been described in embodiment 3; however, both ends of a piezoelectric film element may be supported by support members 9 as shown in FIG. 9A and FIG. 9B. In the latter case, the displacement amount larger than the deflection with both ends fixed can be obtained, and the reflection angle of the light can be varied in a large range, for example.

Figure 10A:
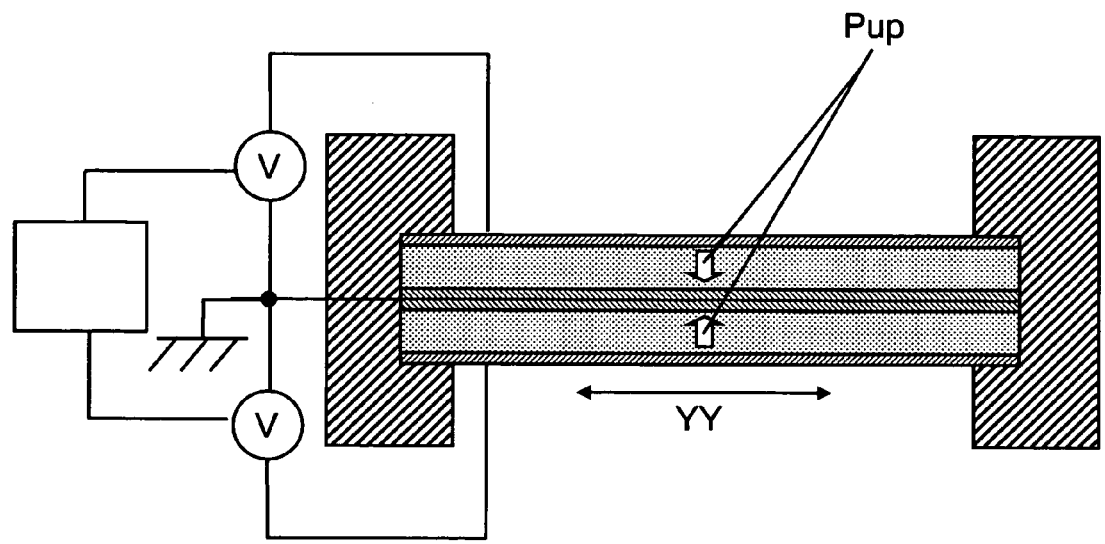
FIG. 10A is a sectional view of a piezoelectric film device having a bimorph-type both-end fixed configuration in accordance with exemplary embodiment 3 of the present invention.
Figure 10B:
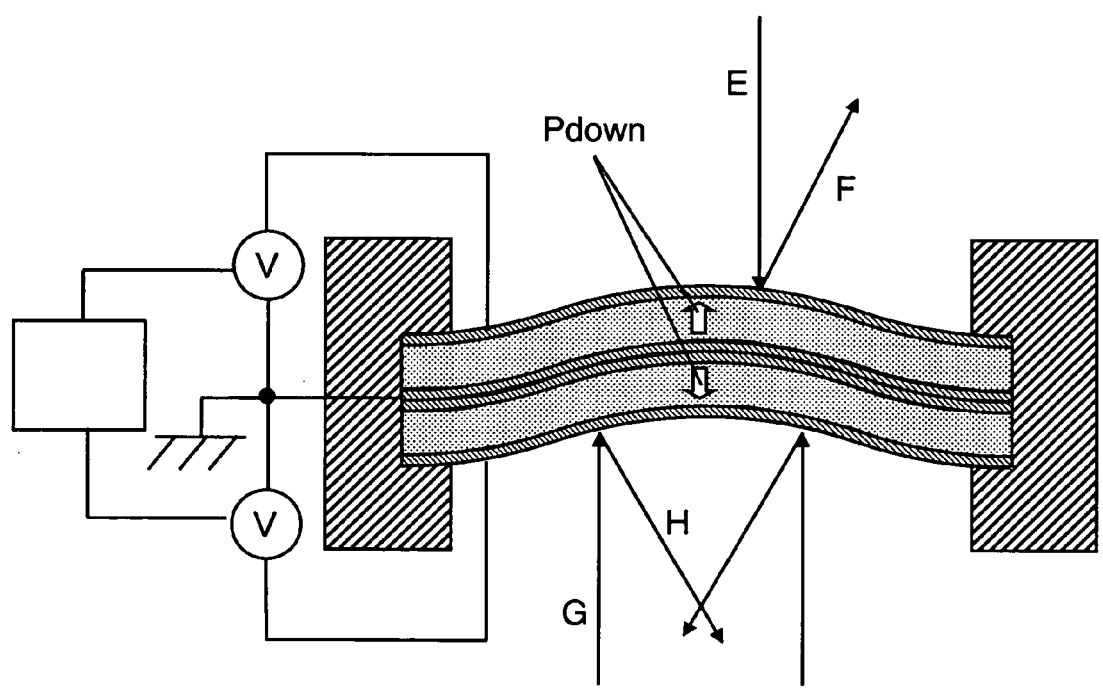
FIG. 10B is a sectional view showing a displacement state when direction of a polarization vector is inverted in the piezoelectric film device.

As shown in FIG. 10A and FIG. 10B, the bimorph-type piezoelectric film device of embodiment 2 may be made to have the both-end fixed configuration of embodiment 3 or have the both-end supported configuration. In the latter cases, advantage similar to that in each embodiment can be obtained, and the piezoelectric film device has high mechanical strength and high resistance to an external load such as vibration or falling impact.

A rectangular piezoelectric film element of which proximities of two facing ends are fixed has been described as an example in embodiment 3; however, the present invention is not limited to this. A piezoelectric film element may have a plate shape and a polygonal electrode-formed surface, and at least two ends or proximities of the ends of the film element may be supported or fixed. This piezoelectric film element can also provide similar operations and advantage.

When the piezoelectric film element is substantially circular, outer peripheral ends thereof or proximities of the outer peripheral ends are supported or fixed, thereby realizing a piezoelectric film device that collects incident light to one point.

Fourth Embodiment

Figure 11A:
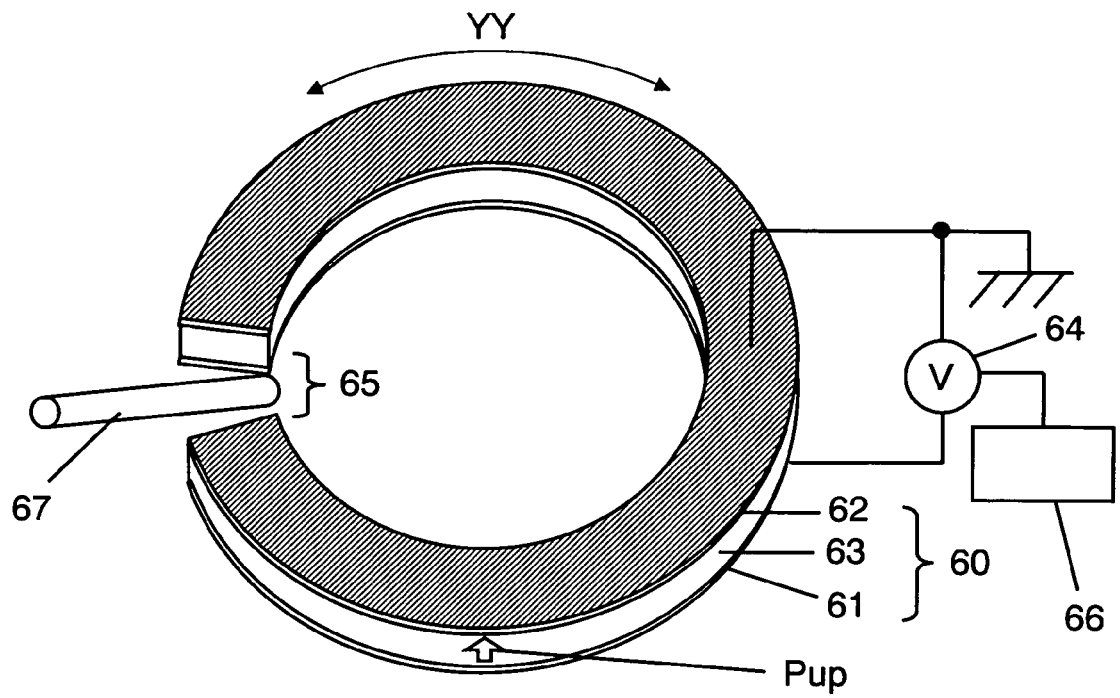
FIG. 11A is a perspective view of a piezoelectric film device having an annular configuration in accordance with exemplary embodiment 4 of the present invention.
Figure 11B:
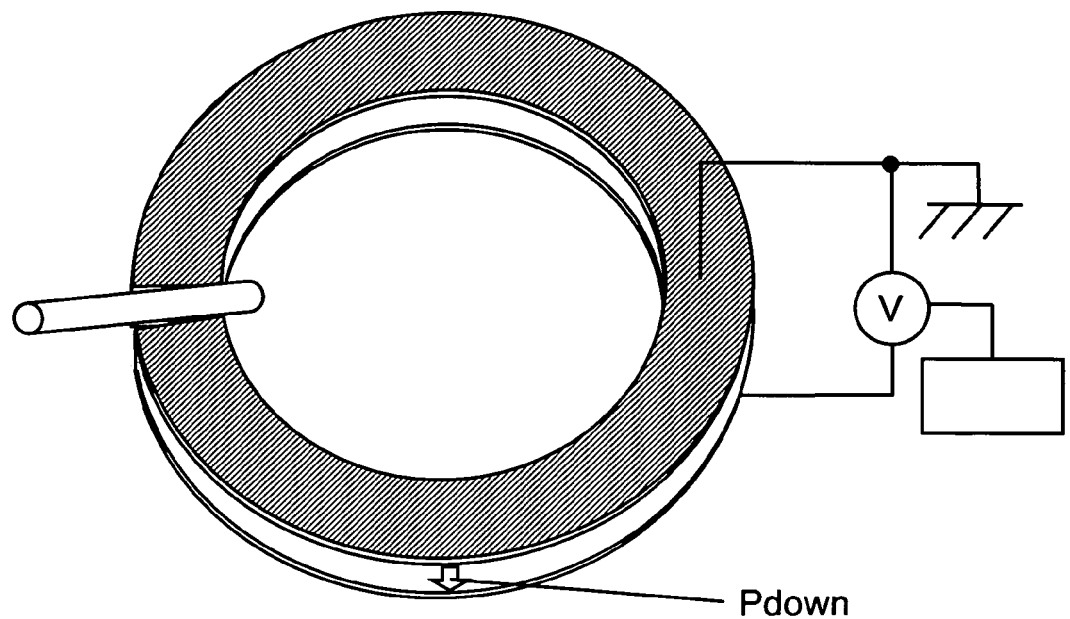
FIG. 11B is a perspective view showing a displacement state when direction of a polarization vector is inverted in the piezoelectric film device.

FIG. 11A is a perspective view of a piezoelectric film device having an annular configuration with polarization vector Pup in accordance with exemplary embodiment 4 of the present invention. FIG. 11B is a perspective view showing a displacement state of the piezoelectric film device when polarization vector Pup is inverted in the polarization vector Pdown direction.

In FIG. 11A and FIG. 11B, annular piezoelectric film element 60 is formed by facing the end surfaces of plate-like piezoelectric film element 60 in the longitudinal direction YY to each other. Annular piezoelectric film element 60 and has first electrode 61, piezoelectric film 63 including polarization vector Pup in the thickness direction, and second electrode 62.

First electrode 61 and second electrode 62 of piezoelectric film element 60 are connected to power supply circuit 64 for applying voltage for inverting the direction of the polarization vector of piezoelectric film 63 and control circuit 66 thereof.

Distance 65 between the end surfaces of piezoelectric film element 60 is set to be a distance for preventing the end surfaces from contacting with each other when at least piezoelectric film element 60 extends. When the entire length of piezoelectric film element 60 is 10 mm and the expansion ratio in inverting the polarization vector is 1.0012 for example, it is preferable that distance 65 is set to be at least 12 μm or more.

The piezoelectric film device having this configuration can be used as a micro gripper as shown in FIG. 11A and FIG. 11B. Here, the micro gripper grips micro object 67 of about 10 μm, for example, on the inversion of polarization vector Pup in the polarization vector Pdown direction, and releases the object on re-inversion of the polarization vector.

The piezoelectric film device can continue to grip micro object 67 without requiring power consumption except when the coercive voltage for inverting the polarization vector is applied.

Figure 12A:
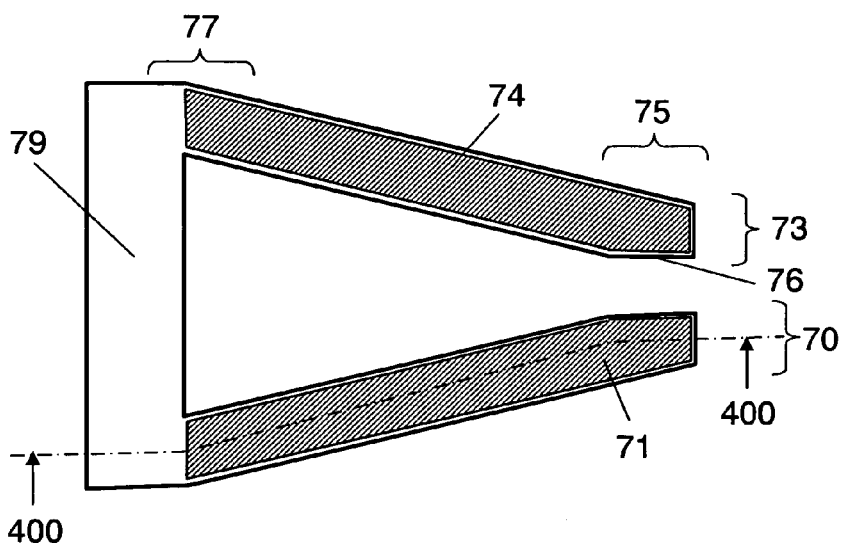
FIG. 12A is a plan view of a deformed piezoelectric film device having a triangular configuration in accordance with exemplary embodiment 4 of the present invention.
Figure 12B:
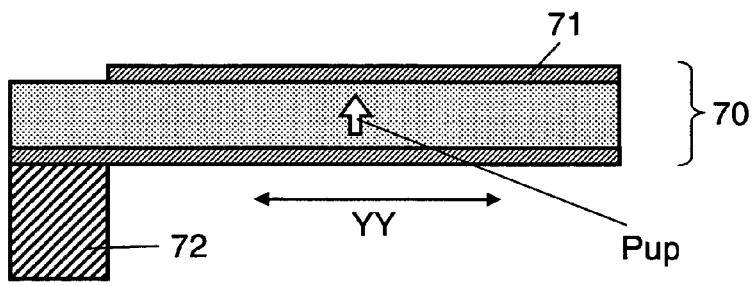
FIG. 12B is a sectional view taken along line 400-400 of FIG. 12A.
Figure 12C:
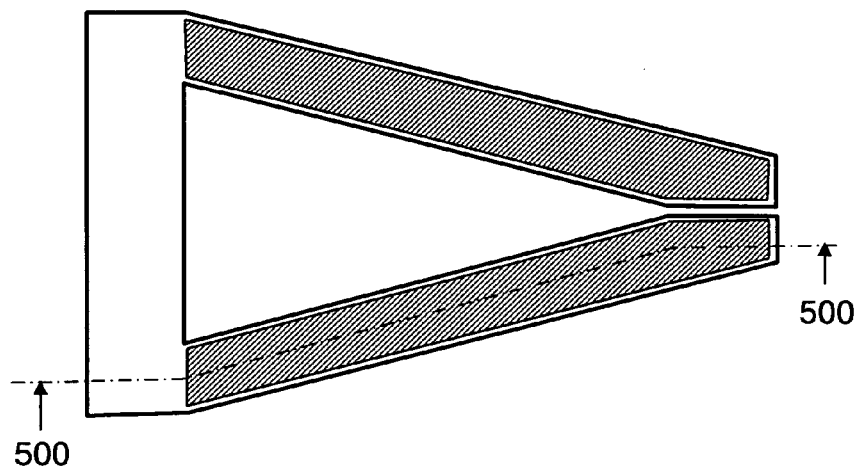
FIG. 12C is a plan view showing a displacement state when direction of a polarization vector is inverted in the piezoelectric film device.
Figure 12D:
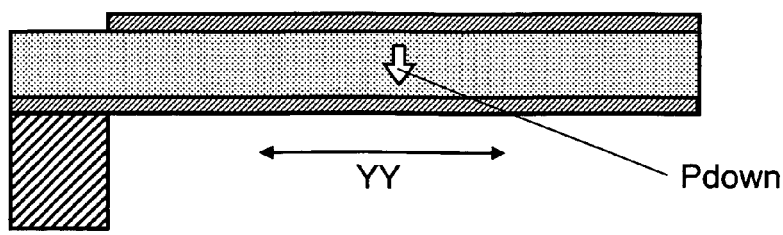
FIG. 12D is a sectional view taken along line 500-500 of FIG. 12C.

As a deformed example of embodiment 4, the piezoelectric film device shown in FIG. 12A to FIG. 12D can be formed. FIG. 12A is a plan view of the triangular piezoelectric film device having a micro gripper function. FIG. 12B is a sectional view taken along line 400-400 of FIG. 12A. FIG. 12C and FIG. 12D show displacement states when direction of the polarization vector is inverted from the states of FIG. 12A and FIG. 12B, respectively.

The deformed piezoelectric film device of embodiment 4 is formed in the following process as shown in FIG. 12A. A piezoelectric film element that is formed in a method similar to that of embodiment 1 and includes PZT film/Pt electrode film/MgO substrate is processed into a triangular shape, and second electrode 71 and fourth electrode 74 are formed on first piezoelectric film element 70 and second piezoelectric film element 73. MgO substrates of first piezoelectric film element 70 and second piezoelectric film element 73 are removed by etching or the like.

Support body 79 is formed of left MgO substrate 72, and Pt electrode film and PZT film that are disposed on it, as shown in FIG. 12B. Cut end surfaces 76 near free ends 75 of first piezoelectric film element 70 and second piezoelectric film element 73 are faced to each other, fixed ends 77 thereof are supported and fixed by support body 79, thereby forming an open/close piezoelectric element that is opened or closed by inversion of the polarization vector. A piezoelectric film device having the open/close piezoelectric element is produced.

The piezoelectric film device having this configuration is put into the state of FIG. 12C by inversion of polarization vector Pup in the polarization vector Pdown direction shown in FIG. 12B and FIG. 12D. In other words, when the inversion is performed, first piezoelectric film element 70 and second piezoelectric film element 73 extend in the longitudinal direction YY to narrow the interval between facing cut end surfaces 76. While, when polarization vector Pdown is inverted in the polarization vector Pup direction, the interval between facing cut end surfaces 76 widens and the piezoelectric film device is put into the state of FIG. 12A.

A piezoelectric film device for gripping an object in opening and closing operations can be realized.

In the deformed example of embodiment 4, the MgO substrate is used as support body 79, and first piezoelectric film element 70 and second piezoelectric film element 73 are integrally formed; however, the present invention is not limited to this. For example, first piezoelectric film element 70 and second piezoelectric film element 73 may be separately formed, and may be grappled, supported, and fixed by different support bodies in an arrangement shown in FIG. 12A.

As other deformed examples of embodiment 4, piezoelectric film devices shown in perspective views of FIG. 13A to FIG. 13C and FIG. 14A to FIG. 14C may be used. The piezoelectric film devices have a plurality of sets of electrodes (electrodes on opposite surfaces are not shown) forming a triangle or a quadrangle, for example.

The supporting method of this piezoelectric film device is not shown, but at least part of the MgO substrate of the piezoelectric film element may be left as shown in FIG. 12B, or part of the piezoelectric film element may be supported and fixed by a different support body. In this case, for reducing effect of expansion and contraction at the inversion time of the polarization vector, it is preferable not to form an electrode in the part supported and fixed by the support body.

Figure 13A:
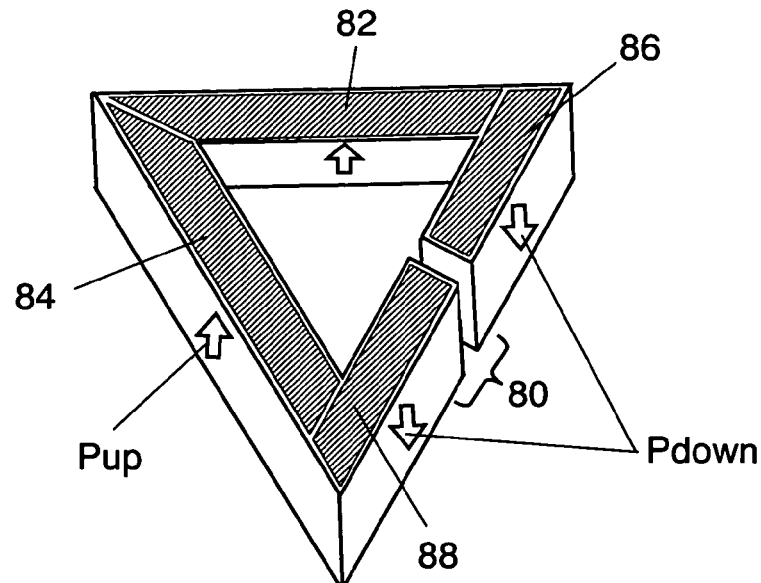
FIG. 13A is a perspective view of another deformed piezoelectric film device having a triangular configuration in accordance with exemplary embodiment 4 of the present invention.
Figure 14A:
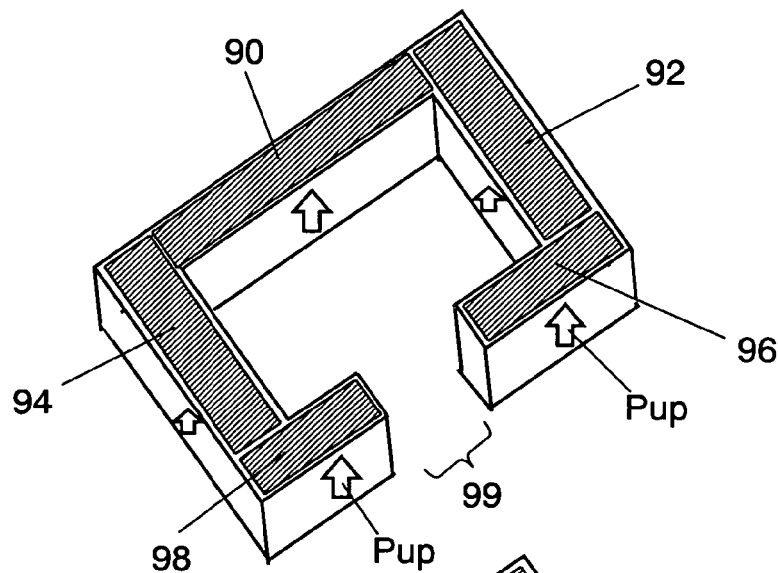
FIG. 14A is a perspective view of a deformed piezoelectric film device having a quadrangular configuration in accordance with exemplary embodiment 4 of the present invention.

In FIG. 13A and FIG. 14A, the surface forming each side of the polygon is covered with any electrode. However, a configuration having no electrode may be used because the intersecting parts of sides of the polygon insignificantly contribute to the expansion and contraction at the inversion time of the polarization vector.

Specific operations of the piezoelectric film device of the deformed examples of embodiment 4 are described hereinafter.

Figure 13B:
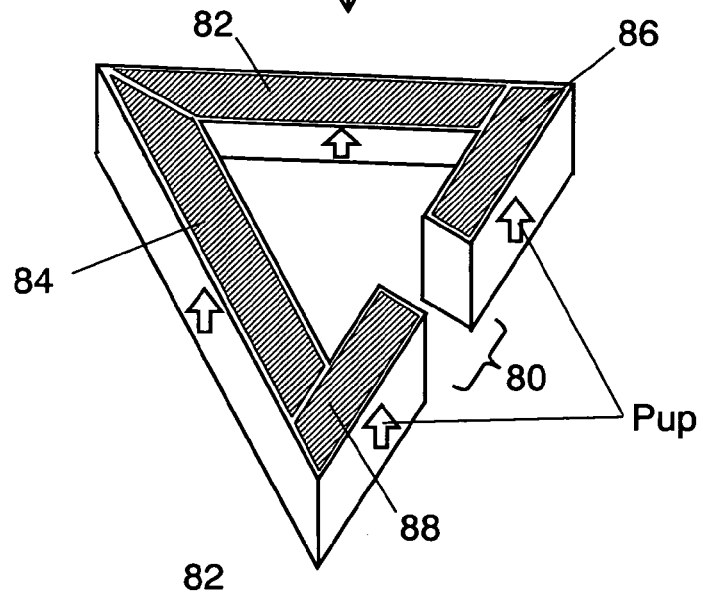
FIG. 13B is a perspective view showing a displacement state when direction of a polarization vector is inverted in the piezoelectric film device.
Figure 13C:
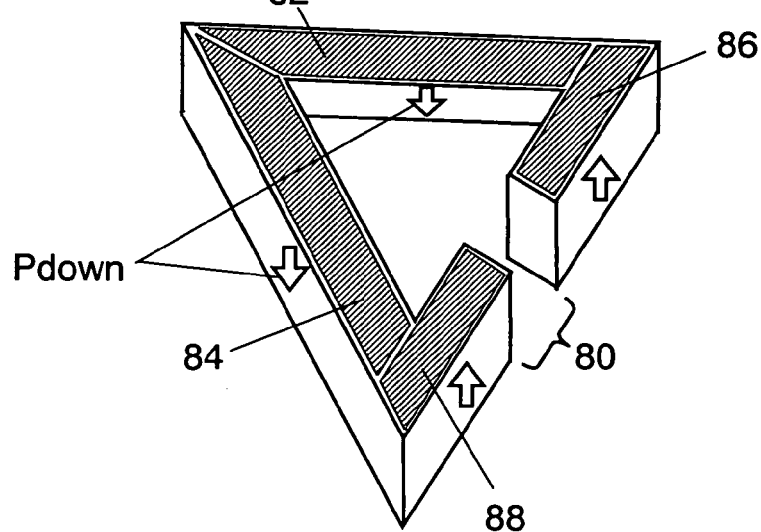
FIG. 13C is a perspective view showing a displacement state when direction of another polarization vector is inverted in the piezoelectric film device.

In the piezoelectric film device shown in FIG. 13A to FIG. 13C, holding section 80 for holding an object in an opening and closing operation is disposed in part of a triangular piezoelectric film element. In this operation, polarization vector Pdown is inverted in the polarization vector Pup direction by applying voltage not lower than the coercive voltage to electrode 86 and electrode 88 from the initial state of FIG. 13A. The clearance of holding section 80 is thus increased to provide an opening state shown in FIG. 13B. While, polarization vector Pup is inverted in the polarization vector Pdown direction, and the clearance of holding section 80 is thus decreased to provide a closing state shown in FIG. 13A. At this time, voltage does not need to be applied to the piezoelectric film element of electrode 82 and electrode 84.

In a similar operation, polarization vector Pup is inverted in the polarization vector Pdown direction by applying voltage not lower than the coercive voltage to electrode 82 and electrode 84 from the initial state of FIG. 13A. The clearance of holding section 80 can be thus varied to cause the opening and closing operation without applying voltage to electrode 86 and electrode 88. In other words, the clearance of holding section 80 can be also varied by expansion and contraction of the piezoelectric film element having electrode 82 and electrode 84.

An operation of the piezoelectric film element caused by applying voltage to electrode 82 and electrode 84 and an expansion and contraction operation of the piezoelectric film element caused by applying voltage to electrode 86 and electrode 88 can be simultaneously performed. The opening and closing amount and the holding force of the piezoelectric film device can be increased.

Figure 14B:
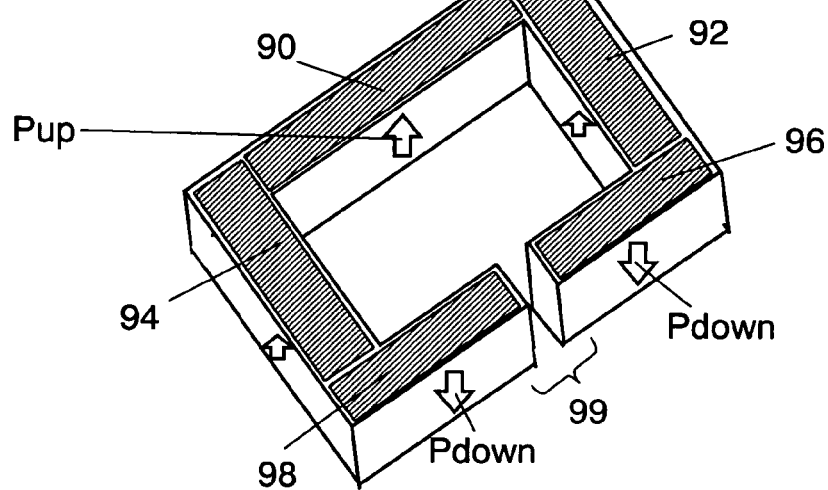
FIG. 14B is a perspective view showing a displacement state when direction of a polarization vector is inverted in the piezoelectric film device.
Figure 14C:
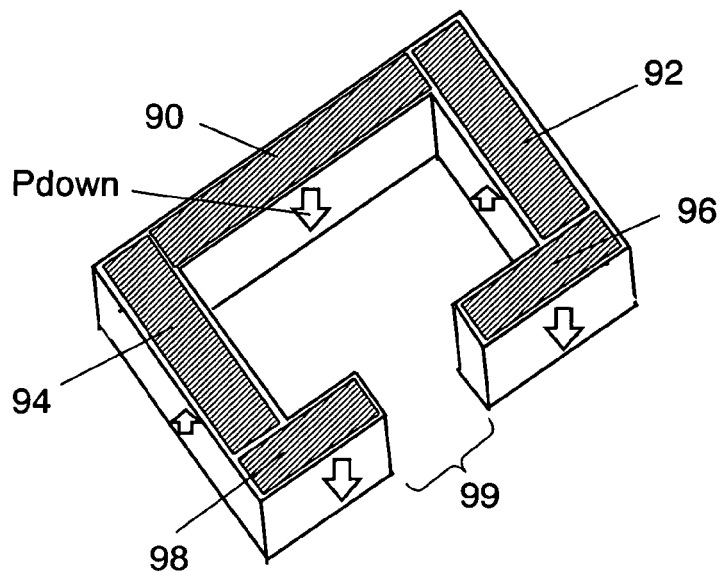
FIG. 14C is a perspective view showing a displacement state when direction of another polarization vector is inverted in the piezoelectric film device.

In the piezoelectric film device shown in FIG. 14A to FIG. 14C, holding section 99 for holding an object in an opening and closing operation is disposed in part of a quadrangular piezoelectric film element. In this operation, polarization vector Pup is inverted in the polarization vector Pdown direction by applying voltage not lower than the coercive voltage to electrode 96 and electrode 98 from the initial state of FIG. 14A. The clearance of holding section 99 is thus decreased to provide a closing state shown in FIG. 14B. While, polarization vector Pdown of FIG. 14B is inverted in the polarization vector Pup direction, and the clearance of holding section 99 is thus increased to provide an initial state shown in FIG. 14A. At this time, voltage does not need to be applied to the piezoelectric film element of electrode 90, electrode 92, and electrode 94.

In a similar operation, polarization vector Pup is inverted in the polarization vector Pdown direction by applying voltage not lower than the coercive voltage to electrode 90 from the displacement state of FIG. 14B. The clearance of holding section 99 can be thus varied to cause the opening and closing operation without applying voltage to electrode 96 and electrode 98, as shown in FIG. 14C. In other words, the clearance of holding section 99 can be varied by expansion and contraction of the piezoelectric film element having electrode 90.

Expansion and contraction operations of the piezoelectric film element formed of electrodes 90, 96 and 98 can be simultaneously performed. The opening and closing amount and the holding force of the piezoelectric film device can be increased.

The expansion and contraction operation of the piezoelectric film element having electrode 92 and electrode 94 is effective when the position of holding section 99 is changed, but an electrode is formed only if necessary.

The configuration of a piezoelectric film element may be the bimorph-type configuration of embodiment 2. In this case, a piezoelectric film device having a displacing function in the film thickness (polarization vector) direction as well as the micro gripper function can be realized.

Figure 15A:
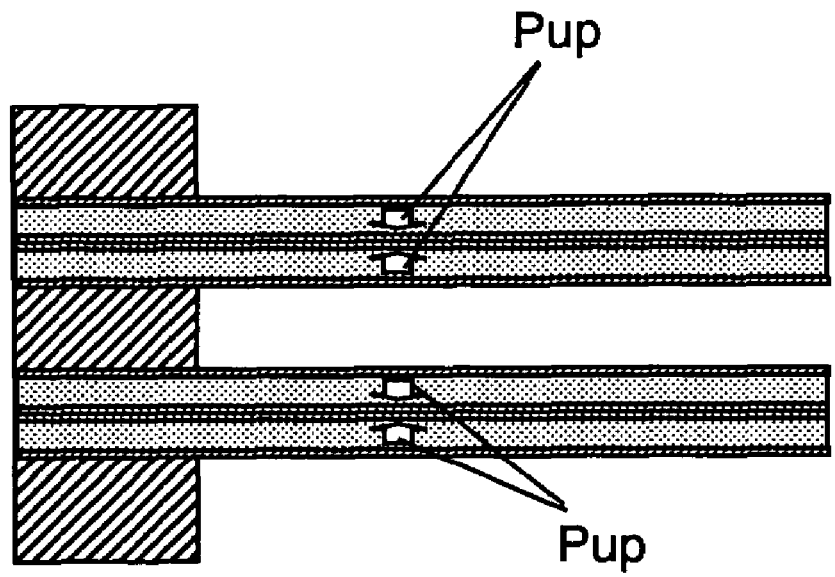
FIG. 15A is a sectional view of a deformed piezoelectric film device having a bimorph-type micro gripper configuration in accordance with exemplary embodiment 4 of the present invention.
Figure 15B:
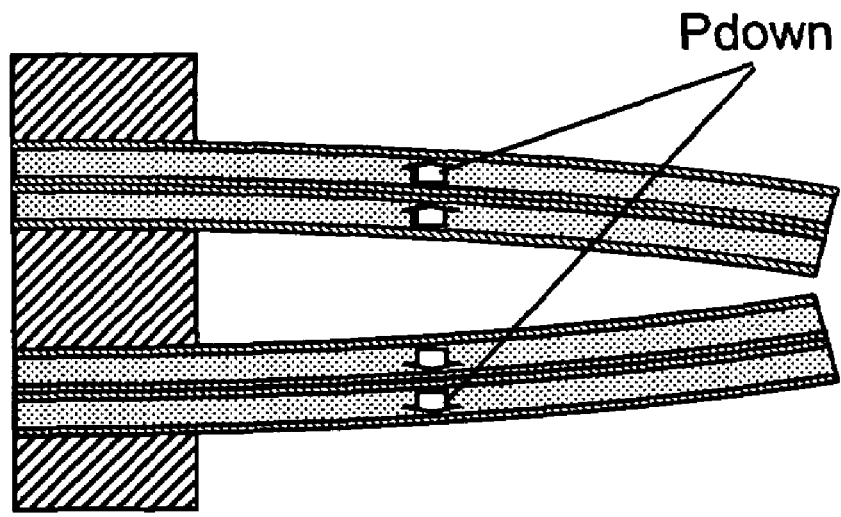
FIG. 15B is a sectional view showing a displacement state when direction of a polarization vector is inverted in the piezoelectric film device.

As another deformed example of embodiment 4, as shown in FIG. 15A, a piezoelectric film device where two sets of bimorph-type piezoelectric film devices of embodiment 2 are faced to each other at a predetermined interval in the film thickness (polarization vector) direction can be realized. In this case, two sets of bimorph-type piezoelectric film elements are deflected to open and close the tips, as shown in FIG. 15B.

For further increasing the opening and closing amount of the piezoelectric film device, various hinge mechanisms using the principle of leverage may be employed. In this case, the opening and closing amount of the micro gripper can be increased, so that a larger object can be gripped. Here, the opening and closing amount is uniquely determined by the difference between the length of the piezoelectric film element and the lattice constant in the polarization vector direction.

Fifth Embodiment

Figure 16A:
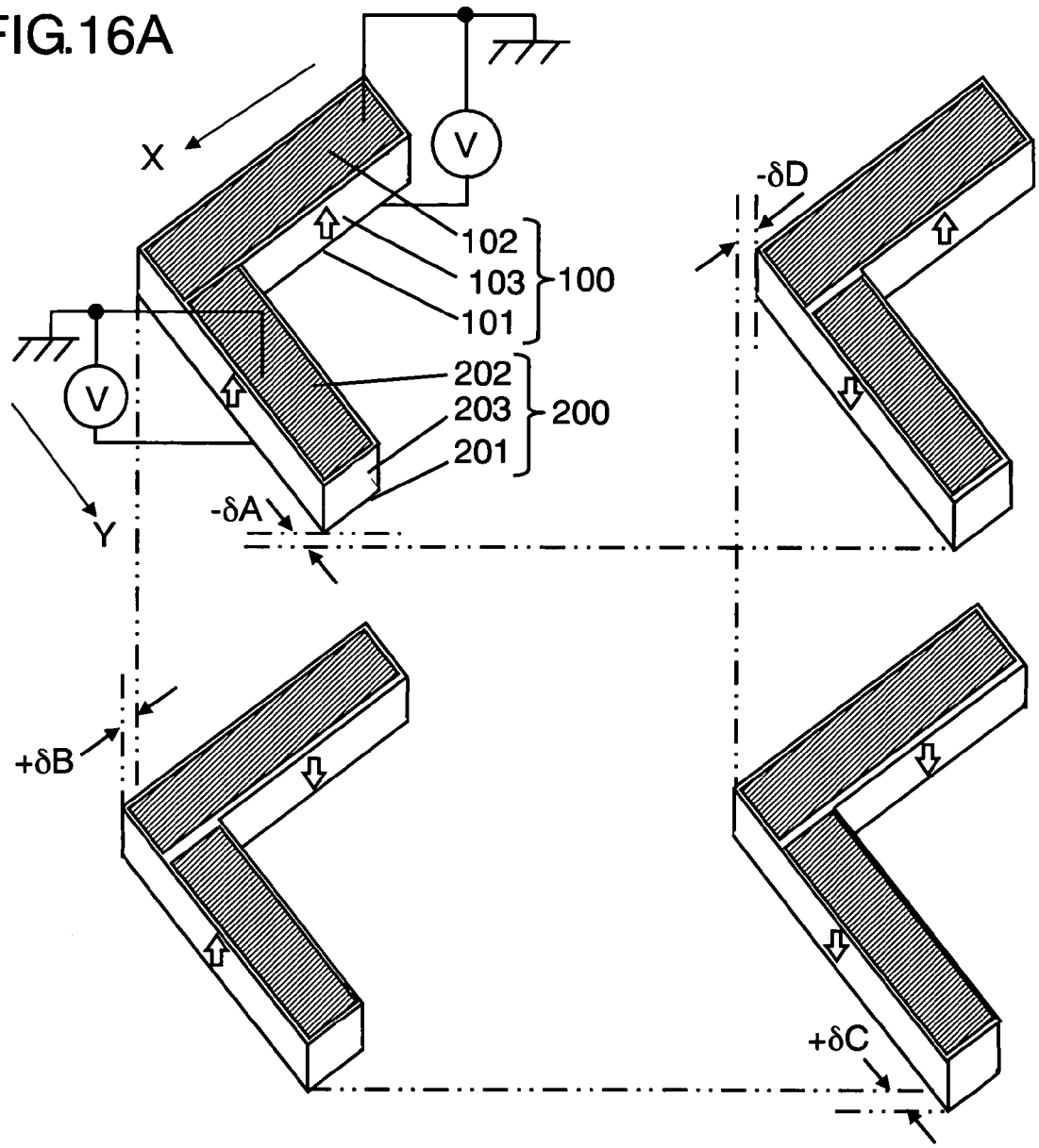
FIG. 16A is a perspective view of a piezoelectric film device having an L-shaped configuration in accordance with exemplary embodiment 5 of the present invention.

FIG. 16A is a perspective view of operations of a piezoelectric film device capable of performing two-dimensional positioning in accordance with exemplary embodiment 5 of the present invention.

Figure 16B:
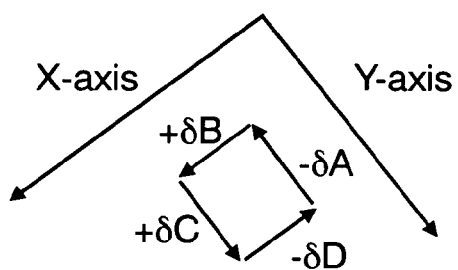
FIG. 16B is a schematic diagram showing a series of displacement operations and displacement states showed in FIG. 16A.

FIG. 16B is a schematic diagram showing a series of displacement behaviors of the piezoelectric film device of FIG. 16A.

In FIG. 16A, an L-shaped piezoelectric film device is formed of a piezoelectric film element having the following elements:

first element section 100 formed of piezoelectric film 103 including polarization vector Pup in the thickness direction and first electrode 101 and second electrode 102 on its upper and lower surfaces; and second element section 200 formed of piezoelectric film 203 including polarization vector Pup in the thickness direction and third electrode 201 and fourth electrode 202 on its upper and lower surfaces.

A manufacturing method of the piezoelectric film element and a forming method of the piezoelectric film are similar to those in each embodiment, and the description is omitted.

Operations of the piezoelectric film device of embodiment 5 are described in details.

The upper left view of FIG. 16A is assumed to show an initial displacement state. In the lower left view of FIG. 16A, coercive voltage not lower than −30V, for example, is applied to first element section 100 to invert polarization vector Pup in the polarization vector Pdown direction, and thus first element section 100 is displaced. First element section 100 is thus extended by +δB in the longitudinal direction.

Next, in the lower right view of FIG. 16A, coercive voltage not lower than −30V, for example, is applied to second element section 200 to invert polarization vector Pup in the polarization vector Pdown direction. Second element section 200 is thus extended by +δC in the longitudinal direction. At this time, assuming that the longitudinal direction of first element section 100 is set to be X-axis and the longitudinal direction of second element section 200 is set to be Y-axis as shown in FIG. 16B, the piezoelectric film element is displaced by +δB in the X-axis direction and by +δC in the Y-axis direction.

In the upper right view of FIG. 16A, coercive voltage not lower than +15V, for example, is applied to first element section 100 to invert polarization vector Pdown in the polarization vector Pup direction. First element section 100 is thus contracted by −δD in the longitudinal direction.

In the upper left view of FIG. 16A, coercive voltage not lower than +15V, for example, is applied to second element section 200 to invert polarization vector Pdown in the polarization vector Pup direction. Second element section 200 is thus contracted by −δA in the longitudinal direction.

Here, +δB is equal to −δD or +δC is equal to −δA because they correspond to variation of the lattice constant by inversion of the polarization vector of the piezoelectric film.

Therefore, the piezoelectric film device returns to the initial state, namely the initial position, shown in FIG. 16B by a series of operations of FIG. 16A.

As discussed above, the piezoelectric film device of embodiment 5 can achieve two-dimensional positioning operations, and the position is kept even when voltage application is stopped. The piezoelectric film device can be used as a determining element capable of selecting four positions, for example.

The L-shaped piezoelectric film device has been described in embodiment 5; however, the present invention is not limited to this. The angles of first element section and second element section with respect to the longitudinal direction are simply required to be different, and thus similar operations can be achieved. A piezoelectric film device having a square U-shaped piezoelectric film element or a plurality of connected L-shaped piezoelectric film elements may be formed.

These configurations allow achievement of a piezoelectric film device capable of arbitrarily positioning a plurality of positions.

Sixth Embodiment

Figure 17:
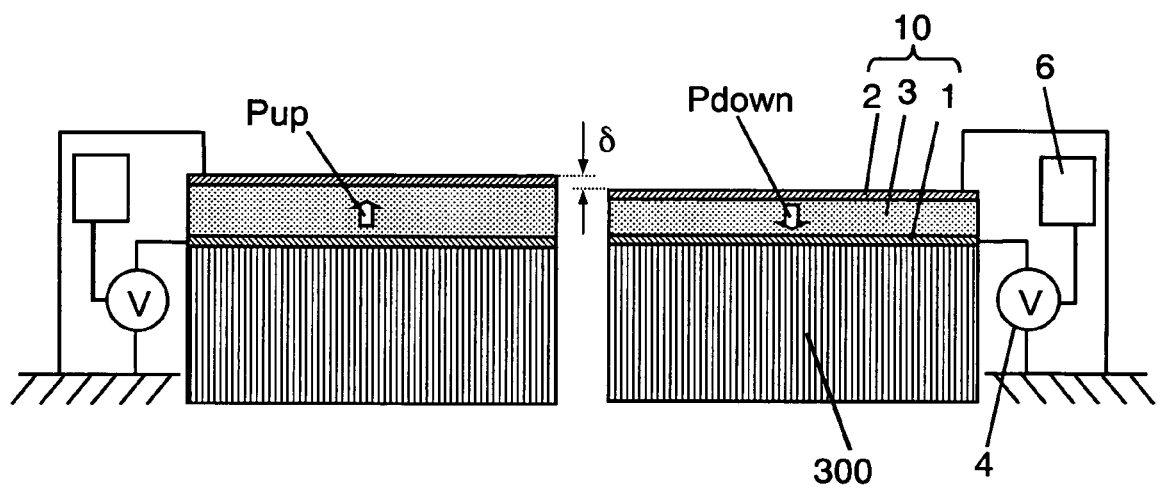
FIG. 17 is sectional views of a piezoelectric film device in accordance with exemplary embodiment 6 of the present invention.

The left view of FIG. 17 is a sectional view of a piezoelectric film device having polarization vector Pup in accordance with exemplary embodiment 6 of the present invention. The right view of FIG. 17 is a sectional view of the piezoelectric film device that is contracted by displacement amount δ by inversion of the polarization vector. The views are partially enlarged to aid understanding.

In the left view of FIG. 17, the piezoelectric film device has the following elements:

piezoelectric film element 10 including first electrode 1, piezoelectric film 3 including polarization vector Pup, and second electrode 2; and MgO substrate 300.

First electrode 1 and second electrode 2 are connected to power supply circuit 4 for applying voltage for inverting the direction of the polarization vector of piezoelectric film 3 and control circuit 6 thereof.

When the direction of the polarization vector of piezoelectric film element 10 formed on MgO substrate 300 shown in the left view of FIG. 17 is inverted, piezoelectric film element 10 is displaced by displacement amount δ in the thickness direction as shown in the right view of FIG. 17. The piezoelectric film element can be returned to the state of the left view of FIG. 17 by inverting the polarization vector from Pdown to Pup.

The reason why the piezoelectric film device of embodiment 6 displaces in the thickness direction is described hereinafter.

The thickness (about 3 μm) of piezoelectric film element 10 is relatively smaller (about $\frac{1}{100}$) than the thickness (about 300 μm) of MgO substrate 300, so that MgO substrate 300 suppresses expansion and contraction in the film in-plane direction (a-axis direction). Therefore, as shown in the right view of FIG. 17, the piezoelectric film element is expanded and contracted in film thickness direction (c-axis direction) at the ratio (0.9976) in Table 1 by inversion of the polarization vector.

This configuration can achieve a piezoelectric film device that can be positioned in the thickness direction of the piezoelectric film element.

When the piezoelectric film device has a layered configuration, the displacement amount can be increased and positioning corresponding to the number of layers is allowed. In other words, when voltage is applied simultaneously to all layers in the piezoelectric film device, the displacement can be increased by a factor of the number of layers. While, when voltage is applied individually to each layer in the piezoelectric film device, positionings corresponding to the number of layers are allowed.

Seventh Embodiment

Figure 18A:
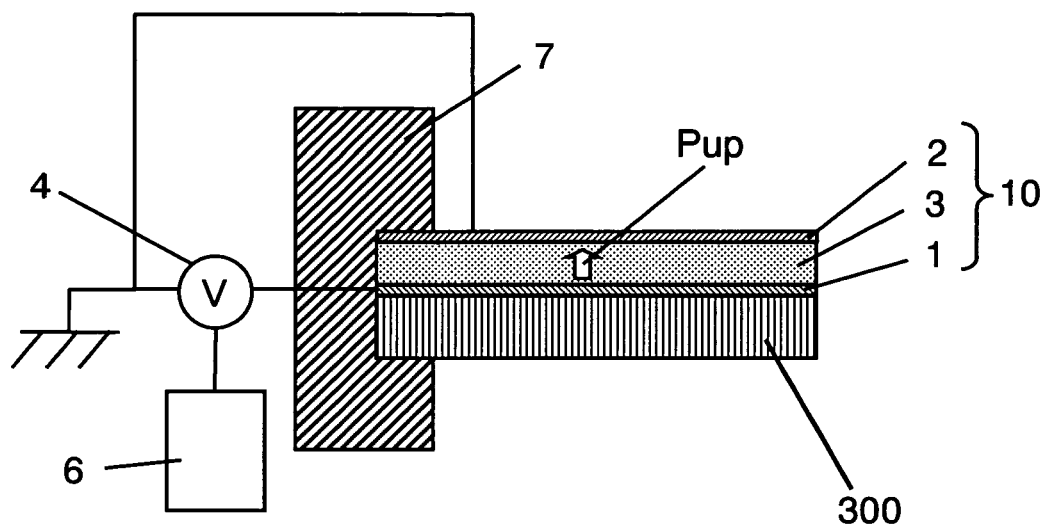
FIG. 18A is a sectional view of a unimorph-type piezoelectric film device in accordance with exemplary embodiment 7 of the present invention.
Figure 18B:
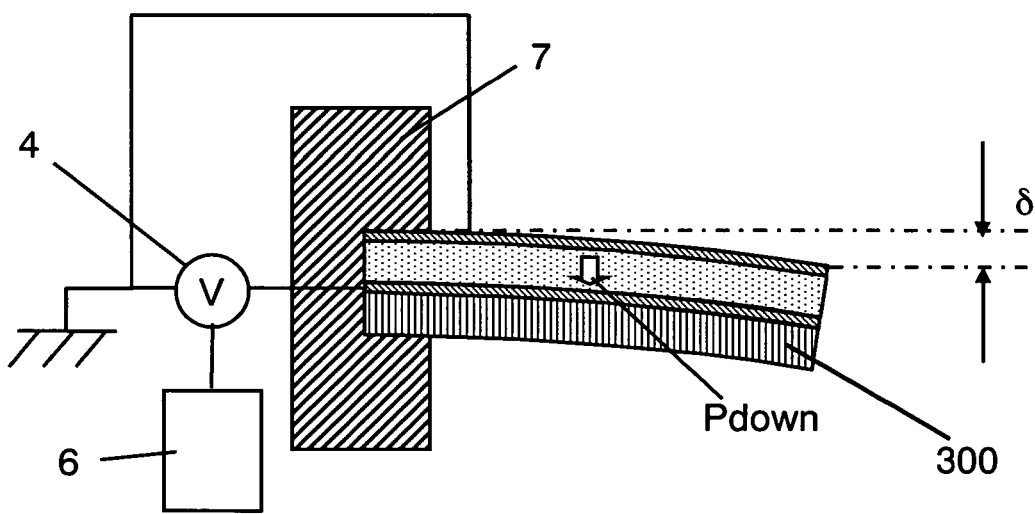
FIG. 18B is a sectional view showing a displacement state when direction of a polarization vector of a piezoelectric film element is inverted in the piezoelectric film device.
Figure 19:
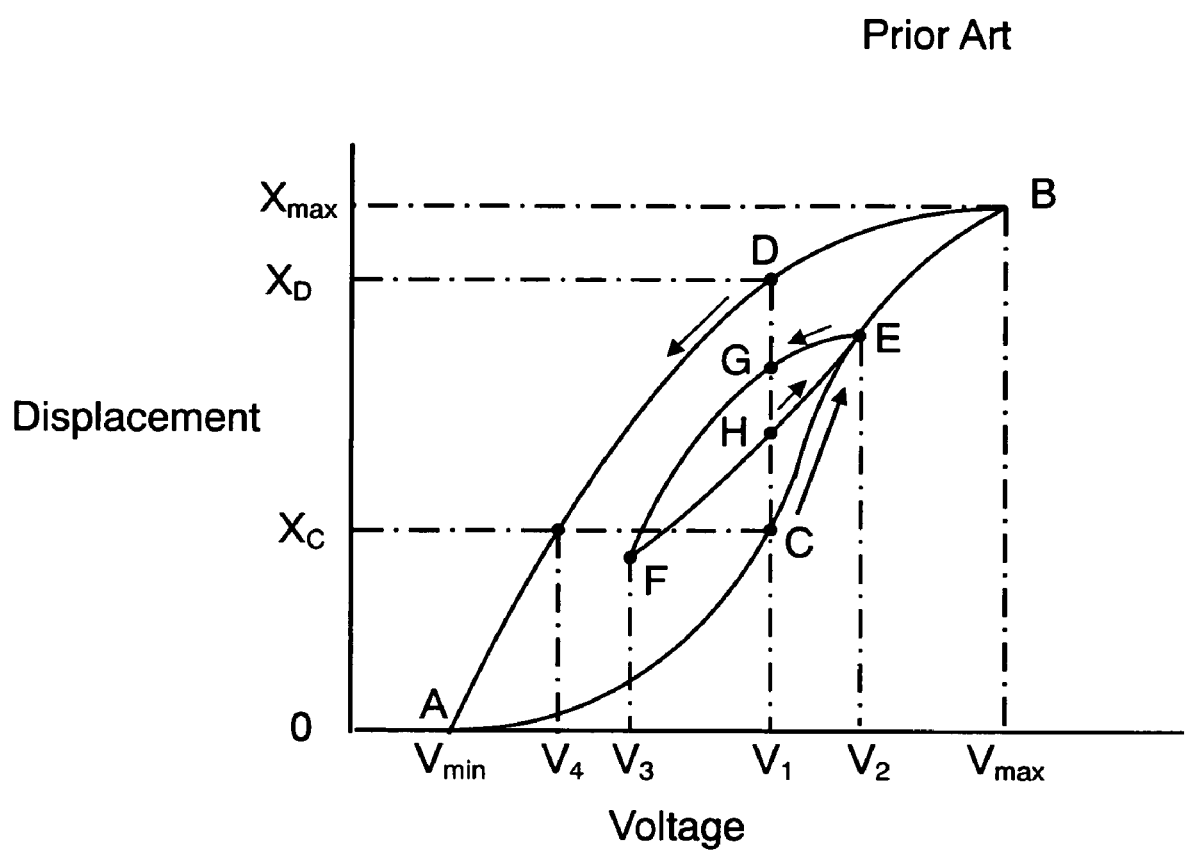
FIG. 19 is a characteristic diagram showing a relation between a displacement amount of a conventional piezoelectric element and driven voltage.

FIG. 18A is a sectional view of a unimorph-type piezoelectric film device in accordance with exemplary embodiment 7 of the present invention. FIG. 18B is a schematic view showing a displacement behavior of the piezoelectric film device.

The unimorph-type piezoelectric film device is formed by supporting and fixing one end of the piezoelectric film device of embodiment 6 with fixing member 7 as shown in FIG. 18A, and the other configuration is similar to that of embodiment 6. In this case, it is preferable to set MgO substrate 300 as thick as piezoelectric film element 10 using the etching method or CMP method for example. This setting allows the deflection amount to be increased.

A unimorph-type piezoelectric film device of FIG. 18B deflected by inverting the direction of the polarization vector is provided similarly to the bimorph-type piezoelectric film device of FIG. 7B. The piezoelectric film device including piezoelectric film element 10 formed on MgO substrate 300 has no adhesive layer, so that the mechanical strength thereof is high and reliability for heat or the like can be improved.

The piezoelectric film device of the present invention is displaced only by applying voltage in the inversion of the polarization vector, and can lie stably at a position after the displacement. As a result, a piezoelectric film device where power consumption is small and a characteristic of keeping positions before and after the displacement is excellent can be achieved.

The piezoelectric film is made of lead zirconate titanate (PZT) in embodiments discussed above; however, the piezoelectric film may be made of barium titanate, lead titanate, or lead lanthanum zirconate titanate.

Variation in lattice constant by inversion of the polarization vector of the piezoelectric film depends on material composition and a film forming condition.

The configurations having up to two layers of piezoelectric film elements are described in embodiments of the present invention; however, the present invention is not limited to this. For example, a piezoelectric film device having a multilayer configuration may be used. Even in this case, each piezoelectric film element can be operated by parallel driving without increasing coercive voltage, and the mechanical strength and the enduring characteristic against an external load such as vibration and falling impact of the piezoelectric film elements can be further improved.

What is claimed is:

1. A piezoelectric film device comprising:
  a piezoelectric film element including:
   a first electrode;
   a second electrode; and
   a piezoelectric film that is sandwiched between the first electrode and the second electrode and has a polarization vector in the film thickness direction, the polarization vector being inverted by application of a predetermined voltage or higher through the first electrode and the second electrode; and
  a power supply circuit for supplying voltage to the piezoelectric device; and
  a control circuit for controlling the voltage supplied to the piezoelectric device by the power supply circuit and for increasing the voltage to said predetermined voltage or higher to invert the polarization vector;
  wherein, the piezoelectric film has each different lattice constant depending on the direction of the polarization vector, and the piezoelectric film element keeps different displacement positions corresponding to the directions of the polarization vector even when the supply of the voltage is stopped.

2. The piezoelectric film device according to claim 1, wherein the piezoelectric film element is driven by voltage about any of the different displacement positions in a range where the polarization vector is prevented from inverting.

3. The piezoelectric film device according to claim 1, wherein an electrode-formed surface of the piezoelectric film element has a polygonal shape.

4. The piezoelectric film device according to claim 3, wherein the piezoelectric film element is fixed at one end or a proximity of the end of the polygonal shape of the piezoelectric film element.

5. The piezoelectric film device according to claim 3, wherein the piezoelectric film element is supported or fixed at least two ends or proximities of the ends of the polygonal shape of the piezoelectric film element.

6. The piezoelectric film device according to claim 1, wherein a principal component of the piezoelectric film is lead zirconate titanate.

7. The piezoelectric film device according to one of claim 1, wherein the power supply circuit selectively applies voltage for inverting the polarization vector and voltage in a range where the polarization vector is prevented from inverting about one of a plurality of displacement positions.

8. The piezoelectric film device according to claim 7, further comprising a control circuit for controlling the power supply circuit.

9. The piezoelectric film device according to one of claim 1, wherein the power supply circuit selectively applies voltage for inverting the polarization vector and voltage in a range where the polarization vector is prevented from inverting about one of a plurality of displacement positions.

10. The piezoelectric film device according to claim 9, further comprising a control circuit for controlling the power supply circuit.

* * * * *